(12) United States Patent
Sato et al.

(10) Patent No.: US 9,079,289 B2
(45) Date of Patent: Jul. 14, 2015

(54) POLISHING PAD

(75) Inventors: Akinori Sato, Osaka (JP); Masato Doura, Osaka (JP)

(73) Assignee: TOYO TIRE & RUBBER CO., LTD., Osaka-Shi (JP)

( * ) Notice: Subject to any disclaimer, the term of this patent is extended or adjusted under 35 U.S.C. 154(b) by 0 days.

(21) Appl. No.: 14/345,195

(22) PCT Filed: Aug. 24, 2012

(86) PCT No.: PCT/JP2012/071473
§ 371 (c)(1),
(2), (4) Date: Mar. 14, 2014

(87) PCT Pub. No.: WO2013/042507
PCT Pub. Date: Mar. 28, 2013

(65) Prior Publication Data
US 2014/0378031 A1    Dec. 25, 2014

(30) Foreign Application Priority Data

Sep. 22, 2011 (JP) ................. 2011207628
Sep. 22, 2011 (JP) ................. 2011207631
Sep. 22, 2011 (JP) ................. 2011207634
Sep. 22, 2011 (JP) ................. 2011207635

(51) Int. Cl.
*B24B 37/20* (2012.01)
*B24B 37/24* (2012.01)
(Continued)

(52) U.S. Cl.
CPC ............... *B24B 37/24* (2013.01); *B24B 37/042* (2013.01); *C08G 18/12* (2013.01);
(Continued)

(58) Field of Classification Search
CPC ........... C08G 18/2835; C08G 18/2865; C08G 18/3814; C08G 18/12; C08G 18/792; C08G 18/10; C08G 18/4018; C08G 42/77; C08G 18/4854; C08G 18/664; C08G 18/6674; C08G 18/724; C08G 18/758; C08G 18/797; C08G 2101/00; H01L 21/305; B24B 37/24; B24B 37/042
USPC .............. 451/41, 527–539, 285–290; 51/296; 521/159
See application file for complete search history.

(56) References Cited

U.S. PATENT DOCUMENTS 3,129,255 A * 4/1964 Hay et al. ............... 585/457
3,134,822 A * 5/1964 Hay et al. ............... 585/457
(Continued)

FOREIGN PATENT DOCUMENTS

JP   2000-017252 A   1/2000
JP   2001-172359 A   6/2001
(Continued)

OTHER PUBLICATIONS

A Notification of Examination Opinions with Search Report issued by Taiwan Intellectual Property Office, mailed May 2, 2014, for Taiwan counterpart application No. 101131997.
(Continued)

*Primary Examiner* — George Nguyen
(74) *Attorney, Agent, or Firm* — Law Office of Katsuhiro Arai

(57) ABSTRACT

The purpose of the present invention is to provide: a polishing pad which has improved dressing properties, while maintaining the hardness; or a polishing pad which does not easily make a scratch on the surface of an object to be polished, while having improved dressing properties. A polishing pad of the present invention is characterized by having a polishing layer that is formed of a polyurethane resin foam or an unfoamed polyurethane resin, and is also characterized in that the polyurethane resin foam or the unfoamed polyurethane resin contains, as starting material components, (A) an isocyanate component, (B) a polyol component and (C) an aromatic compound that has one hydroxyl group and/or an aromatic compound that has one amino group.

19 Claims, 1 Drawing Sheet

(51) Int. Cl.

| | |
|---|---|
| *C08G 18/48* | (2006.01) |
| *C08G 18/66* | (2006.01) |
| *C08G 18/72* | (2006.01) |
| *C08G 18/79* | (2006.01) |
| *C08G 18/12* | (2006.01) |
| *C08G 18/28* | (2006.01) |
| *C08G 18/40* | (2006.01) |
| *C08G 18/42* | (2006.01) |
| *B24B 37/04* | (2012.01) |
| *C08G 18/32* | (2006.01) |
| *C08G 18/76* | (2006.01) |
| *H01L 21/304* | (2006.01) |
| *C08G 18/75* | (2006.01) |
| *C08G 18/38* | (2006.01) |
| *C08G 101/00* | (2006.01) |

(52) U.S. Cl.
CPC ....... *C08G 18/2835* (2013.01); *C08G 18/3206* (2013.01); *C08G 18/3243* (2013.01); *C08G 18/3814* (2013.01); *C08G 18/4018* (2013.01); *C08G 18/4277* (2013.01); *C08G 18/4854* (2013.01); *C08G 18/664* (2013.01); *C08G 18/6674* (2013.01); *C08G 18/724* (2013.01); *C08G 18/758* (2013.01); *C08G 18/7621* (2013.01); *C08G 18/792* (2013.01); *C08G 18/797* (2013.01); *H01L 21/304* (2013.01); *C08G 2101/00* (2013.01)

(56) References Cited

U.S. PATENT DOCUMENTS

| | | | |
|---|---|---|---|
| 3,152,162 A | 10/1964 | Peter et al. | |
| 4,513,124 A | 4/1985 | Hoffman | |
| 4,950,694 A | 8/1990 | Hager | |
| 5,124,368 A | 6/1992 | Gill et al. | |
| 5,539,011 A | 7/1996 | Hilker et al. | |
| 5,952,457 A * | 9/1999 | Kouno et al. | 528/408 |
| 6,986,705 B2 * | 1/2006 | Preston et al. | 451/526 |
| 7,029,747 B2 * | 4/2006 | Huh et al. | 428/217 |
| 7,202,385 B2 | 4/2007 | Mueller et al. | |
| 7,262,227 B2 | 8/2007 | Shibanuma et al. | |
| 2001/0003360 A1 * | 6/2001 | Shahid | 252/397 |
| 2002/0078632 A1 * | 6/2002 | Hasegawa et al. | 51/298 |
| 2004/0121714 A1 | 6/2004 | Horie et al. | |
| 2004/0224622 A1 * | 11/2004 | Sakurai et al. | 451/526 |
| 2005/0003749 A1 * | 1/2005 | Hosaka et al. | 451/527 |
| 2005/0043422 A1 | 2/2005 | Shibanuma et al. | |
| 2005/0064709 A1 * | 3/2005 | Shimomura et al. | 438/689 |
| 2005/0070619 A1 | 3/2005 | Miller | |
| 2006/0037699 A1 | 2/2006 | Nakamori et al. | |
| 2006/0089095 A1 * | 4/2006 | Swisher et al. | 451/533 |
| 2006/0229000 A1 | 10/2006 | Izumi et al. | |
| 2006/0270328 A1 | 11/2006 | Horie et al. | |
| 2006/0280929 A1 | 12/2006 | Shimomura et al. | |
| 2006/0280930 A1 | 12/2006 | Shimomura et al. | |
| 2008/0085943 A1 | 4/2008 | Doura et al. | |
| 2008/0148649 A1 | 6/2008 | Liu | |
| 2008/0153395 A1 | 6/2008 | Kulp et al. | |
| 2008/0319096 A1 * | 12/2008 | Mayer et al. | 521/159 |
| 2009/0137191 A1 * | 5/2009 | Lee | 451/36 |
| 2010/0029185 A1 * | 2/2010 | Fukuda et al. | 451/527 |
| 2010/0035529 A1 | 2/2010 | Kulp et al. | |
| 2010/0247868 A1 | 9/2010 | Cha et al. | |
| 2010/0314784 A1 * | 12/2010 | Miyazaki et al. | 264/1.35 |
| 2010/0317263 A1 | 12/2010 | Hirose et al. | |
| 2012/0202409 A1 * | 8/2012 | Shinchi et al. | 451/526 |
| 2012/0208912 A1 * | 8/2012 | Sasaki et al. | 521/115 |
| 2012/0302148 A1 * | 11/2012 | Bajaj et al. | 451/527 |
| 2012/0322348 A1 | 12/2012 | Yokoi et al. | |
| 2013/0035021 A1 | 2/2013 | Doura et al. | |
| 2014/0378031 A1 * | 12/2014 | Sato et al. | 451/41 |

FOREIGN PATENT DOCUMENTS

| | | | |
|---|---|---|---|
| JP | 3359629 | B1 | 10/2002 |
| JP | 2003-037089 | A | 2/2003 |
| JP | 2004-136432 | A | 5/2004 |
| JP | 2006-110665 | A | 4/2006 |
| JP | 2006-206625 | A | 8/2006 |
| JP | 2006-297582 | A | 11/2006 |
| JP | 2006-334745 | A | 12/2006 |
| JP | 2008-168422 | A | 7/2008 |
| JP | 2010-058220 | A | 3/2010 |
| JP | 2010-064153 | A | 3/2010 |
| JP | 2010-240769 | A | 10/2010 |
| TW | 200837181 | A | 9/2008 |
| TW | 200942557 | A | 10/2009 |
| TW | 201006854 | A | 2/2010 |
| TW | 201041952 | A | 12/2010 |
| TW | 201130871 | A | 9/2011 |
| WO | 2009/113399 | A1 | 9/2009 |

OTHER PUBLICATIONS

A Notice of Reasons for Refusal issued by Japanese Patent Office, mailed Oct. 25, 2013, for a co-pending Japanese counterpart application No. 2010-072948.

A Notification of Examination Opinions with Search Report issued by Taiwan Intellectual Property Office, mailed Jan. 21, 2014, for a co-pending Taiwan counterpart application No. 100109873.

A Notification of First Office Action with Search Report issued by the State Intellectual Property Office of China, mailed Apr. 1, 2014, for a co-pending Chinese counterpart application No. 201180011398.3.

An Office Action issued by the Korean Patent Office, mailed Nov. 27, 2013, for a co-pending Korean counterpart application No. 10-2012-7022940.

International Search Report (ISR) mailed Jun. 7, 2011, issued for a co-pending international application No. PCT/JP2011/056455.

Non-final Office action issued by the USPTO, dated Sep. 26, 2014, for a co-pending U.S. Appl. No. 13/634,218.

International Search Report (ISR) mailed Sep. 25, 2012, issued for international application No. PCT/JP2012/071473.

A Notification of Examination Opinions with Search Report issued by Taiwan Intellectual Property Office, mailed Nov. 5, 2014, for Taiwan counterpart application No. 101131997.

Notification of Transmittal of Translation of the International Preliminary Report on Patentability (PCT/IB/338) mailed Apr. 3, 2014, with International Preliminary Report on Patentability (PCT/IB/373) and Written Opinion of the International Searching Authority (PCT/ISA/237), for corresponding international application PCT/JP2012/071473.

Final Office action issued by the USPTO, dated Apr. 30, 2015, for co-pending U.S. Appl. No. 13/634,218.

* cited by examiner

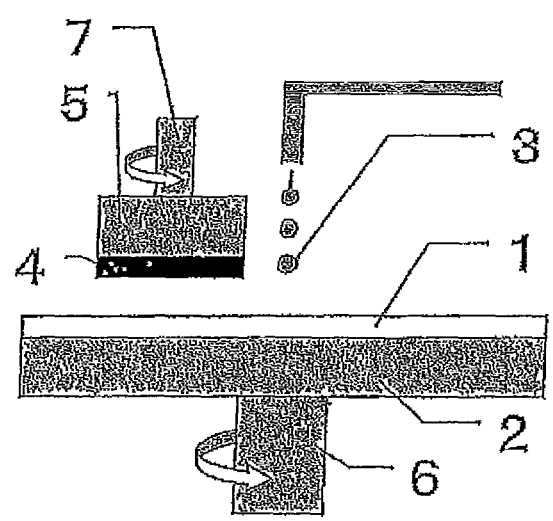

POLISHING PAD

This application is the U.S. National Phase under 35 U.S.C. §371 of International Application PCT/JP2012/071473, filed Aug. 24, 2012, which claims priorities to Japanese Patent Applications No. 2011-207628, filed Sep. 22, 2011; No. 2011-207635, filed Sep. 22, 2011; No. 2011-207631, filed Sep. 22, 2011; and No. 2011-207634, filed Sep. 22, 2011. The International Application was published under PCT Article 21(2) in a language other than English.

TECHNICAL FIELD

The present invention relates to a polishing pad capable of performing planarization of materials requiring a high surface planarity such as optical materials including a lens and a reflecting mirror, a silicon wafer, an aluminum substrates and a product of general metal polishing with stability and a high polishing efficiency. A polishing pad of the invention is preferably employed, especially, in a planarization step of a silicon wafer or a device on which an oxide layer or a metal layer has been formed prior to further stacking an oxide layer or a metal layer thereon. Further, the present invention relates to a polishing pad (for rough polishing or final polishing) used in polishing the surfaces of optical materials such as a lens and a reflecting mirror etc., a silicon wafer, an aluminum substrates etc. Particularly, the polishing pad of the present invention is used preferably as a polishing pad for final polishing.

BACKGROUND ART

Typical materials requiring surface flatness at high level include a single-crystal silicon disk called a silicon wafer for producing semiconductor integrated circuits (IC, LSI). The surface of the silicon wafer should be flattened highly accurately in a process of producing IC. LSI etc., in order to provide reliable semiconductor connections for various coatings used in manufacturing the circuits. In the step of polishing finish, a polishing pad is generally stuck on a rotatable supporting disk called a platen, while a workpiece such as a semiconductor wafer is stuck on a polishing head. By movement of the two, a relative speed is generated between the platen and the polishing head while polishing slurry having abrasive grains is continuously supplied to the polishing pad, to effect polishing processing.

As polishing characteristics of a polishing pad, it is requested that a polished object is excellent in planarity and within wafer non-uniformity and a polishing rate is large. A planarity and within wafer non-uniformity of a polished object can be improved to some extent with a polishing layer higher in elastic modulus. A polishing rate can be bettered by increasing a holding quantity of a slurry on a foam with cells therein.

Polishing pads including a polyurethane foam are proposed as polishing pads that meet the above properties (see Patent Documents 1 and 2). Such a polyurethane foam is produced by a reaction of an isocyanate-terminated prepolymer with a chain extender (curing agent), in which in view of hydrolysis resistance, elastic properties, wear resistance, or the like, a polyether (a polytetramethylene glycol with a number average molecular weight of 500 to 1,600) or a polycarbonate is preferably used as a high molecular polyol component for the isocyanate prepolymer.

Generally, when planarization of a large number of semiconductor wafers is performed using a polishing pad, a fine uneven portion of the surface of the polishing pad is worn to deteriorate the performance of supplying the polishing agent (slurry) to the surface to be processed of the semiconductor wafer, decrease the speed of planarizing the surface to be processed of the wafer, or deteriorate the planarization characteristics. Therefore, after having performed the planarization of a predetermined number of semiconductor wafers, it is necessary to renew/roughen (dress) the surface of the polishing pad by using a dresser. When dressing is carried out for a predetermined period of time, uncountable fine uneven portions are produced on the surface of the polishing pad, so that the surface of the polishing pad becomes fluffy.

However, the conventional polishing pad has a problem that the dressing speed during dressing is low and such dressing takes too much time.

In order to solve the above problem, Patent Document 3 proposes a technique of using a polymerized diisocyanate and an aromatic diisocyanate as an isocyanate component that is a starting material for polyurethane resin foams.

However, there is a tendency such that when a polymerized diisocyanate is used, the hardness of the polyurethane resin foam increases and when a polishing pad formed of the polyurethane resin foam is used, scratches are likely to occur on the surface of an object to be polished.

Further, as a polishing pad satisfying the above characteristics, Patent Document 4 proposes a polishing pad that is formed of an unfoamed synthetic resin.

The polishing pad that is formed of an unfoamed body has a problem that the cut rate is low at the time of dressing and that the dressing takes too much time.

In order to solve this problem, Patent Document 5 proposes a polishing pad having a polishing layer that is formed of an unfoamed polyurethane, wherein the unfoamed polyurethane is a reaction hardened body of a polyurethane starting material composition which contains an isocyanate-terminated prepolymer obtained by the reaction of a prepolymer starting material composition containing a diisocyanate, a high molecular weight polyol, and a low molecular weight polyol; a modified isocyanate which is polymerized by the addition of three or more diisocyanates; and a chain extender, and the amount added of the modified isocyanate being 5 to 30 parts by weight per 100 parts by weight of the isocyanate-terminated prepolymer.

The polishing pad is one which hardly causes scratches on the surface of an object to be polished while having improved dressing properties, but further improvement thereof will be required in the future.

PRIOR ART DOCUMENTS

Patent Documents

Patent Document 1: JP-A-2000-17252
Patent Document 2: JP-B2-3359629
Patent Document 3: JP-A-2006-297582
Patent Document 4: JP-A-2006-110665
Patent Document 5: JP-A-2010-240769

SUMMARY OF THE INVENTION

Problems to be Solved by the Invention

An object of the present invention according to first to third aspects thereof is to provide a polishing pad which has improved dressing properties while maintaining the hardness. An object of the present invention according to a fourth aspect thereof is to provide a polishing pad which does not easily make a scratch on the surface of an object to be polished while having improved dressing properties. Still another object of the present invention is to provide a method for manufacturing a semiconductor device by using the polishing pad.

Means for Solving the Problems

As a result of investigations to solve the problems, the inventors have found that the objects can be achieved with the polishing pad described below, and have completed the invention.

The first aspect of the invention is related to a polishing pad comprising a polishing layer that is formed of a polyurethane resin foam having closed cells, wherein the polyurethane resin foam contains, as starting material components, (A) an isocyanate component, (B) a polyol component, and (C) an aromatic compound having one hydroxyl group and/or an aromatic compound having one amino group.

The second aspect of the invention is related to a polishing pad comprising a polishing layer that is formed of a polyurethane resin foam, wherein the polyurethane resin foam contains, as starting material components, (A) an isocyanate component, (B) a polyol component, (C) an aromatic compound having one hydroxyl group and/or an aromatic compound having one amino group, and (D) hollow microspheres.

The third aspect of the invention is related to a polishing pad comprising a polishing layer that is formed of a polyurethane resin foam having interconnected cells, wherein the polyurethane resin foam contains, as starting material components, (A) an isocyanate component, (B) a polyol component, and (C) an aromatic compound having one hydroxyl group and/or an aromatic compound having one amino group.

The fourth aspect of the invention is related to a polishing pad comprising a polishing layer that is formed of an unfoamed polyurethane resin, wherein the unfoamed polyurethane resin contains, as starting material components, (A) an isocyanate component, (B) a polyol component, and (C) an aromatic compound having one hydroxyl group and/or an aromatic compound having one amino group.

The fourth aspect of the present invention is characterized in that a polishing layer is formed with an unfoamed polyurethane resin. It is thereby possible to effectively suppress the occurrence of scratches on the surface to be polished because the contact area between an object to be polished and a polishing layer is increased and the surface pressure applied to the object to be polished is reduced to be uniform.

The reasons for difficult dressing of conventional polishing pads are considered to be as follows: 1) the specific gravity of the polishing layer is high and 2) the material itself of the polishing layer has a property of being "tough". In order to attain easy dressing of the surface of the polishing layer, it is conceivable to reduce the specific gravity. However, simple reduction of the specific gravity is not preferable because the hardness of the polishing pad as a whole is reduced to deteriorate planarization characteristics. It is also conceivable to reduce the molecular weight of a high molecular weight polyol or to increase the amount added of a low molecular weight polyol in order to maintain the hardness while decreasing the specific gravity, but in such a case, the abrasion wear of the surface of the polishing layer becomes higher than necessary to reduce the lifetime of the polishing pad, and the fluffiness of the surface of the polishing layer after dressing is eliminated immediately at the time of wafer polishing, thereby to have a tendency toward decrease of the polishing rate.

The present invention is characterized in that (C) an aromatic compound having one hydroxyl group and/or an aromatic compound having one amino group is used as an active hydrogen group-containing compound to be reacted with an isocyanate component. Usually, as the active hydrogen group-containing compound to be reacted with the isocyanate component, there is employed a compound having two active hydrogen groups, such as diols and diamines, and the two active hydrogen groups of the diol (or diamine) and the two isocyanate groups of the isocyanate component are sequentially reacted with each other for polymerization so that a polyurethane resin is obtained. On the other hand, because the aromatic compound used in the present invention has only one active hydrogen group in the molecule, polymerization can be partially inhibited. Thus, it is possible to disperse a relatively low molecular weight polymer in the polyurethane resin, and also possible to reduce the "toughness" of the polyurethane resin itself while maintaining the hardness of the polyurethane resin.

The aromatic compound having one hydroxyl group is preferably a compound represented by the following general formula (1):

$$R^1-(OCH_2CHR^2)_n-OH \quad (1)$$

wherein $R^1$ is an aromatic hydrocarbon group, $R^2$ is hydrogen or a methyl group, and n is an integer of 1 to 5.

In addition, the aromatic compound having one amino group is preferably aniline or a derivative thereof.

The content of the aromatic compound having one hydroxyl group and/or the aromatic compound having one amino group is preferably an amount corresponding to 0.01 to 0.3 equivalent of the active hydrogen group (hydroxyl group and/or amino group) of the aromatic compound per 1 equivalent of isocyanate group of the isocyanate component. If the equivalent of the active hydrogen group of the aromatic compound is less than 0.01, the content of the low molecular weight polymer to be dispersed in the polyurethane resin is reduced, so that the "toughness" of the polyurethane resin itself becomes difficult to be reduced. As a result, it becomes difficult to improve the dressing properties of the polishing pad. On the other hand, if the equivalent of the active hydrogen group of the aromatic compound exceeds 0.3, the content of the low molecular weight polymer to be dispersed in the polyurethane resin is too high, so that the abrasion wear of the surface of the polishing layer becomes higher than necessary to reduce the lifetime of the polishing pad, and the fluffiness of the surface of the polishing layer after dressing is eliminated immediately at the time of wafer polishing, thereby to decrease the polishing rate.

In the first to third aspects of the present invention, the cut rate of the polishing pad is preferably 3.5 to 10 μm/min. If the cut rate is less than 3.5 μm/min, it becomes difficult to improve the production efficiency of the semiconductor wafer because the effect of reducing the dressing time is insufficient. On the other hand, if the cut rate is more than 10 μm/min, the abrasion wear of the surface of the polishing layer becomes higher than necessary to reduce the lifetime of the polishing pad, and the fluffiness of the surface of the polishing layer after dressing is eliminated immediately at the time of wafer polishing, thereby to cause a tendency toward decrease of the polishing rate.

In the fourth aspect of the present invention, the cut rate of the polishing pad is preferably 2 to 4 μm/min. If the cut rate is less than 2 μm/min, it becomes difficult to improve the production efficiency of the semiconductor wafer because the effect of reducing the dressing time is insufficient. On the other hand, if the cut rate is more than 4 μm/min, the abrasion wear of the surface of the polishing layer becomes higher than necessary to reduce the lifetime of the polishing pad, and the fluffiness of the surface of the polishing layer after dressing is eliminated immediately at the time of wafer polishing, thereby to cause a tendency toward decrease of the polishing rate.

The present invention also relates to a method for manufacturing a semiconductor device, including the step of polishing a surface of a semiconductor wafer by using the polishing pad.

Effect of the Invention

The polishing pad of the first to third aspects of the present invention is one that has improved dressing properties while maintaining the hardness. Use of the polishing pad greatly improves the production efficiency of the semiconductor wafer because the dressing time can be shortened.

The polishing pad of the fourth aspect of the present invention is one with which scratches are unlikely to occur on the surface of an object to be polished and which has improved dressing properties while maintaining the hardness. Use of the polishing pad greatly improves the production efficiency of the semiconductor wafer because the dressing time can be shortened.

BRIEF DESCRIPTION OF THE DRAWINGS

FIG. 1 is a schematic diagram showing a typical polishing apparatus for use in CMP polishing.

MODE FOR CARRYING OUT THE INVENTION

The polishing pad of the first aspect of the present invention has a polishing layer that is formed of a polyurethane resin foam having closed cells.

The polishing pad of the second aspect of the present invention has a polishing layer that is formed of a polyurethane resin foam.

The polishing pad of the third aspect of the present invention has a polishing layer that is formed of a polyurethane resin foam having interconnected cells.

The polishing pad of the fourth aspect of the present invention has a polishing layer that is formed of an unfoamed polyurethane resin.

The polishing pad of the present invention may be formed only of the polishing layer or may be formed of a laminate of the polishing layer and another layer (for example, a cushion layer or a base layer).

Polyurethane is a preferred material for forming the polishing layer, because polyurethane is excellent in abrasion resistance and polymers with desired physical properties can be easily obtained by varying the raw material composition.

The polyurethane resin contains, as starting material components, (A) an isocyanate component, (B) a polyol component (a high molecular weight polyol, a low molecular weight polyol, or a low molecular weight polyamine), and (C) an aromatic compound having one hydroxyl group and/or an aromatic compound having one amino group.

As the isocyanate component, a compound known in the field of polyurethane can be used without particular limitation. The isocyanate component includes, for example, aromatic diisocyanates such as 2,4-toluene diisocyanate, 2,6-toluene diisocyanate, 2,2'-diphenyl methane diisocyanate, 2,4'-diphenyl methane diisocyanate, 4,4'-diphenyl methane diisocyanate, polymeric MDI, carbodiimide-modified MDI (for example, Millionate MTL made by Nippon Polyurethane Industry Co., Ltd.), 1,5-naphthalene diisocyanate, p-phenylene diisocyanate, m-phenylene diisocyanate, p-xylylene diisocyanate and m-xylylene diisocyanate, aliphatic diisocyanates such as ethylene diisocyanate, 2,2,4-trimethyl hexamethylene diisocyanate and 1,6-hexamethylene diisocyanate, and cycloaliphatic diisocyanates such as 1,4-cyclohexane diisocyanate, 4,4'-dicyclohexyl methane diisocyanate, isophorone diisocyanate and norbornane diisocyanate. These may be used alone or as a mixture of two or more thereof. Among these, it is preferable to use an aromatic diisocyanate, and it is more preferable to use a carbodiimide-modified MDI. Further, a combination use of toluene diisocyanate and dicyclohexylmethane diisocyanate is preferred.

A polymerized diisocyanate may be used together with the diisocyanate described above. The polymerized diisocyanate is an isocyanate-modified product that is polymerized by the addition of three or more diisocyanates, or a mixture thereof. Examples of the isocyanate-modified product include 1) trimethylolpropane adduct type, 2) biuret type, and 3) isocyanurate type, among which the isocyanurate type is particularly preferred.

As the high molecular weight polyol, a compound known in the field of polyurethane can be used without particular limitation. The high molecular weight polyol includes, for example, polyether polyols represented by polytetramethylene ether glycol and polyethylene glycol, polyester polyols represented by polybutylene adipate, polyester polycarbonate polyols exemplified by reaction products of polyester glycols such as polycaprolactone polyol and polycaprolactone with alkylene carbonate, polyester polycarbonate polyols obtained by reacting ethylene carbonate with a multivalent alcohol and reacting the resulting reaction mixture with an organic dicarboxylic acid, polycarbonate polyols obtained by ester exchange reaction of a polyhydroxyl compound with aryl carbonate, and polymer polyols such as polyether polyol in which polymer particles are dispersed. These may be used singly or as a mixture of two or more thereof.

To produce the polyurethane resin foam having an interconnected cell structure, a polymer polyol is preferably used, and particularly a polymer polyol in which polymer particles comprising acrylonitrile and/or a styrene-acrylonitrile copolymer are dispersed is preferably used. This polymer polyol is contained in an amount of preferably 20 to 100% by weight, more preferably 30 to 60% by weight in the whole high molecular weight polyol used.

The high molecular weight polyol (including the polymer polyol) is contained in an amount of 60 to 95% by weight, more preferably 70 to 90% by weight in the polyol component. By using the high molecular weight polyol in the specified amount, cell films are easily broken to easily form an interconnected cell structure.

Among the high molecular weight polyols, a high molecular weight polyol having a hydroxyl value of 30 to 350 mg KOH/g is preferably used. The hydroxyl value is more preferably 100 to 320 mg KOH/g. When the hydroxyl value is less than 30 mg KOH/g, the amount of a hard segment in the polyurethane is reduced so that durability tends to be reduced, while when the hydroxyl value is greater than 350 mg KOH/g, the degree of crosslinking of the polyurethane foam becomes so high that the foam tends to be brittle.

No limitation is imposed on a number-average molecular weight of a high molecular weight polyol but it is preferably 500 to 5000, more preferably 500 to 3500 from the viewpoint of an elastic characteristic of an obtained polyurethane resin. If a number-average molecular weight thereof is less than 500, a polyurethane resin obtained by using the polyol does not have a sufficient elastic characteristic and easy to be brittle, and a polishing pad made from the polyurethane resin is excessively hard, which sometimes causes scratches to be generated on a surface of an object to be polished. Moreover, since a polishing pad is easy to be worn away, it is unpreferable from the viewpoint of a life of a polishing pad. On the other hand, if a number-average molecular weight thereof exceeds 5000, a polishing pad made from a polyurethane resin obtained from such a polyol is unpreferably soft to thereby disable a sufficiently satisfiable planarity or durability to be earned.

Examples of the low molecular weight polyol as a polyol component that can be used together with a high molecular weight polyol described above include: ethylene glycol, 1,2-propylene glycol, 1,3-propylene glycol, 1,2-butanediol, 1,3-butanediol, 1,4-butanediol, 2,3-butanediol, 1,6-hexanediol, neopentyl glycol, 1,4-cyclohexanedimethanol, 3-methyl-1,5-pentanediol, diethylene glycol, triethyleneglycol, 1,4-bis(2-hydroxyethoxy)benzene, trimethylolpropane, glycerin, 1,2,6-hexanetriol, pentaerythritol, tetramethylolcyclohexane, methyl glucoside, sorbitol, mannitol, dulcitol, sucrose, 2,2,6,6-tetrakis(hydroxymethyl)cyclohexanol, diethanolamine, N-methyldiethanolamine, triethanolamine and the like. Other examples that can be used together with the high molecular weight polyol also include: low molecular weight polyamine such as ethylenediamine, tolylenediamine, diphenylmethanediamine, diethylenetriamine and the like. Still other examples that can be used together with the high molecular weight polyol also include: alcoholamines such as monoethanolamine, 2-(2-aminoethylamino)ethanol, monopropanolamine and the like. These low molecular weight polyol, low molecular weight polyamine etc. may be used alone or as a mixture of two or more thereof. The amount added of each of the low molecular weight polyol and the low molecular weight polyamine is not particularly limited, and is appropriately determined according to the properties required for the polishing pad (polishing layer) to be manufactured.

To produce the polyurethane resin foam having an interconnected cell structure, a low molecular weight polyol having a hydroxyl value of 400 to 1830 mg KOH/g and/or a low molecular weight polyamine having an amine value of 400 to 1870 mg KOH/g are preferably used. The hydroxyl value is more preferably 900 to 1500 mg KOH/g, and the amine value is more preferably 400 to 950 mg KOH/g. When the hydroxyl value is less than 400 mg KOH/g or the amine value is less than 400 mg KOH/g, an effect of improving formation of interconnected cells tends to be not sufficiently obtained. On the other hand, when the hydroxyl value is greater than 1830 mg KOH/g or the amine value is greater than 1870 mg KOH/g, a wafer tends to be easily scratched on the surface. Particularly, diethylene glycol, 1,2-propylene glycol, 1,3-butanediol, 1,4-butanediol, or trimethylolpropane is preferably used.

To produce the polyurethane resin foam having an interconnected cell structure, the low molecular weight polyol, the low molecular weight polyamine and the alcohol amine are contained in the total amount of preferably 5 to 40 wt %, more preferably 10 to 30 wt %, in a polyol component. By using the low molecular weight polyol etc. in specified amounts, cell films are easily broken to easily form an interconnected cell structure and further the mechanical characteristics of the polyurethane foam are improved.

There is no particular limitation on the aromatic compound having one hydroxyl group so long as it is an aromatic hydrocarbon substituted with one hydroxyl group or an aromatic hydrocarbon substituted with an organic group having one hydroxyl group. Examples of the aromatic hydrocarbon include benzene, naphthalene, anthracene, biphenyl, indene, and the like. Further, the aromatic hydrocarbon may have a substituent other than those described above. Examples of the organic group having one hydroxyl group include an alkanol group, a glycol group, and the like. In the present invention, it is particularly preferable to use a compound represented by the following general formula (1):

$$R^1-(OCH_2CHR^2)_n-OH \quad (1)$$

wherein $R^1$ is an aromatic hydrocarbon group, $R^2$ is hydrogen or a methyl group, and n is an integer of 1 to 5.

Examples of the compound represented by the general formula (1) include ethylene glycol monophenyl ether, diethylene glycol monophenyl ether, polyoxyethylene monophenyl ether, propylene glycol monophenyl ether, dipropylene glycol monophenyl ether, polyoxypropylene monophenyl ether, polyoxypropylene monomethyl phenyl ether, and the like.

There is no particular limitation on the aromatic compound having one amino group so long as it is an aromatic hydrocarbon substituted with one amino group or an aromatic hydrocarbon substituted with an organic group having one amino group. Examples of the aromatic hydrocarbon are the same as those described above. Examples of the organic group having one amino group include an aminoalkyl group, an aminoalkenyl group, and the like. In the present invention, aniline and derivatives thereof are particularly preferably used.

Examples of the aromatic compound having one amino group include aniline, methylaniline (toluidine), dimethylaniline (xylidine), methoxyaniline (anisidine), isopropylaniline (cumidine), N-methylaniline, 2-phenylethylamine, and the like.

The content of the aromatic compound is preferably an amount corresponding to 0.01 to 0.3 equivalent, more preferably an amount corresponding to 0.05 to 0.25 equivalent of the active hydrogen group (hydroxyl group and/or amino group) of the aromatic compound per 1 equivalent of the isocyanate group of the isocyanate component (including an isocyanate-terminated prepolymer).

In a case where a polyurethane resin foam or an unfoamed polyurethane resin is produced by means of a prepolymer method, a chain extender is used in curing of a prepolymer. A chain extender is an organic compound having at least two active hydrogen groups and examples of the active hydrogen group include: a hydroxyl group, a primary or secondary amino group, a thiol group (SH) and the like. Concrete examples of the chain extender include: polyamines such as 4,4'-methylenebis(o-chloroaniline)(MOCA), 2,6-dichloro-p-phenylenediamine, 4,4'-methylenebis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethylene glycol-di-p-aminobenzoate, polytetramethylene oxide-di-p-aminobenzoate, 4,4'-diamino-3,3',5,5'-tetraethyldiphenylmethane, 4,4'-diamino-3,3'-diisopropyl-5,5'-dimethyldiphenylmethane, 4,4'-diamino-3,3',5,5'-tetraisopropyldiphenylmethane, 1,2-bis(2-aminophenylthio)ethane, 4,4'-diamino-3,3'-diethyl-5,5'-dimethyldiphenylmethane, N,N'-di-sec-butyl-4,4'-diaminophenylmethane, 3,3'-diethyl-4,4'-diaminodiphenylmethane, m-xylylenediamine, N,N'-di-sec-butyl-p-phenylenediamine, m-phenylenediamine and p-xylylenediamine; a low moleculer weight polyol component; and a low molecular weight polyamine component. The chain extenders described above may be used either alone or in mixture of two kinds or more. In particular, it is preferable to use a non-halogenated aromatic diamine such as 3,5-bis(methylthio)-2,4-toluenediamine and 3,5-bis(methylthio)-2,6-toluenediamine.

A polyurethane resin foam can be produced by applying a melting method, a solution method or a known polymerization technique, among which preferable is a melting method, consideration being given to a cost, a working environment and the like.

Manufacture of a polyurethane resin foam is enabled by means of either a prepolymer method or a one shot method, of which preferable is a prepolymer method in which an isocyanate-terminated prepolymer is synthesized from an isocyanate component and a polyol component in advance, with which a chain extender is reacted since physical properties of an obtained polyurethane resin is excellent.

When the prepolymer method is used, the aromatic compound that has been reacted with the isocyanate component in advance may be incorporated into the structure of the isocyanate-terminated prepolymer, or may be added at the time of curing the isocyanate-terminated prepolymer synthesized from an isocyanate component and a polyol component.

Further, in the prepolymer method, (1) an isocyanate-terminated prepolymer A containing an isocyanate component A, a high molecular weight polyol A, and a low molecular weight polyol and (2) an isocyanate-terminated prepolymer B obtained by the reaction of a starting material composition which contains an isocyanate component B, a high molecular weight polyol B, and the aromatic compound described above and which has an NCO Index of 3 to 5 may be used in combination.

The isocyanate component A is preferably toluene diisocyanate and dicyclohexylmethane diisocyanate, and the high molecular weight polyol A is preferably a polyether polyol having a number average molecular weight of 500 to 5000. There is no particular limitation on the NCO Index in preparing the isocyanate-terminated prepolymer A, and it is usually about 1.5 to 2.5.

The isocyanate component B is preferably an isocyanurate type hexamethylene diisocyanate, and the high molecular weight polyol B is preferably a polyether polyol or a polyester polyol, each having a number average molecular weight of 200 to 5000. The number average molecular weight is more preferably 200 to 2000.

In the first aspect of the present invention, examples of the method for manufacturing a polyurethane resin foam include a method of adding hollow beads, a mechanical foaming method (a mechanical froth method), a chemical foaming method, and the like. These methods may be used in combination, but the mechanical foaming method using a silicone-based surfactant formed of a polyalkylsiloxane/polyether copolymer is preferable. As the silicone-based surfactant, SH-192 and L-5340 (manufactured by Toray Dow Corning Silicone Co., Ltd.), B-8443 and B-8465 (manufactured by Goldschmidt Co., Ltd.), and the like can be mentioned as preferable compounds. The silicone-based surfactant is added to the polyurethane starting material composition preferably in an amount of 0.05 to 10% by weight, more preferably in an amount of 0.1 to 5% by weight.

Incidentally, if necessary, stabilizers (e.g. antioxidants), lubricants, pigments, fillers, antistatic agents, and other additives may be added.

An example of manufacture of a thermosetting polyurethane resin foam of a closed cell type constituting a polishing pad (polishing layer) by a prepolymer method will be described below. A method for manufacturing such a polyurethane resin foam has the following steps.

1) Foaming Step of Preparing Cell Dispersion Liquid

A silicone-based surfactant is added to a first component containing an isocyanate-terminated prepolymer to a concentration of 0.05 to 10% by weight of the polyurethane resin foam, followed by stirring in the presence of a non-reactive gas, and the non-reactive gas is dispersed as fine cells to prepare a cell dispersion liquid. When the prepolymer is in a solid form at normal temperature, the prepolymer is used after being melted by pre-heating to an appropriate temperature.

2) Curing Agent (Chain Extender) Mixing Step

A second component containing a chain extender is added to the cell dispersion liquid, followed by mixing under stirring to give a foaming reaction liquid.

3) Casting Step

The foaming reaction liquid is poured into a mold.

4) Curing Step

The foaming reaction liquid poured into the mold is reaction-cured by heating.

If the aromatic compound having one hydroxyl group is not incorporated into the structure of the isocyanate-terminated prepolymer, such an aromatic compound is preferably added at the time of preparing the cell dispersion liquid because the reaction thereof is slow.

On the other hand, if the aromatic compound having one amino group is not incorporated into the structure of the isocyanate-terminated prepolymer, such an aromatic compound is preferably added at the time of preparing the foaming reaction liquid because the reaction thereof is quick.

In the second aspect of the present invention, hollow microspheres are used so as to foam the polyurethane resin. If the prepolymer method is used, the hollow microspheres may be added to the first component containing an isocyanate-terminated prepolymer, or may be added to the second component containing a chain extender, but it is preferred to add the hollow microspheres to the first component so that they are uniformly dispersed in the polyurethane resin foam.

The hollow microspheres are those which are hollow in the inside and whose outer shell is made of resin. In the present invention, known hollow microspheres may be used without particular limitation, and examples of the microspheres include EXPANCEL DE (manufactured by Japan Fillite Co., Ltd.), MICROPEARL (manufactured by Matsumoto Yushi Kogyo Co., Ltd.), ARBOCEL (manufactured by Rettenmaier & Sohne, Ltd.), Matsumoto Microsphere F (manufactured by Matsumoto Yushi-Seiyaku Co., Ltd.), and the like.

The amount added of the hollow microspheres is not particularly limited, and they are add preferably in an amount of 1.5 to 2.5% by weight, more preferably 1.8 to 2.3% by weight of the polyurethane resin foam.

Incidentally, if necessary, stabilizers (e.g. antioxidants), lubricants, pigments, fillers, antistatic agents, and other additives may be added.

An example of a method for manufacturing a thermosetting polyurethane resin foam constituting a polishing pad (polishing layer) will be described below. A method for manufacturing such a polyurethane resin foam has the following steps.

1) Mixing Step of Hollow Microspheres

Hollow microspheres are added to a first component containing an isocyanate-terminated prepolymer to a concentration of 1.5 to 2.5% by weight of the polyurethane resin foam, followed by uniform dispersing to obtain a dispersion liquid. When the prepolymer is in a solid form at normal temperature, the prepolymer is used after being melted by pre-heating to an appropriate temperature.

2) Mixing Step of Curing Agent (Chain Extender)

A second component containing a chain extender is added to the dispersion liquid, followed by mixing to obtain a reaction liquid.

3) Casting Step

The reaction liquid is poured into a mold.

4) Curing Step

The reaction liquid poured into the mold is reaction-cured by heating.

If the aromatic compound having one hydroxyl group is not incorporated into the structure of the isocyanate-terminated prepolymer, such an aromatic compound is preferably added at the time of preparing the dispersion liquid because the reaction thereof is slow.

On the other hand, if the aromatic compound having one amino group is not incorporated into the structure of the isocyanate-terminated prepolymer, such an aromatic compound is preferably added at the time of preparing the reaction liquid because the reaction thereof is quick.

In the method of producing the polyurethane resin foam, heating and post-curing of the foam obtained after casting and reacting the reaction liquid in a mold until the dispersion lost fluidity are effective in improving the physical properties of the foam, and are extremely preferable.

Production of the polyurethane resin foam may be in a batch system where each component is weighed out, introduced into a vessel and mixed or in a continuous production system where each component is continuously supplied to, and stirred in, a stirring apparatus and the resulting reaction liquid is transferred to produce molded articles.

A manufacturing method of a polishing pad may be performed in ways: in one of which a prepolymer and hollow microspheres which are a raw material from which a polyurethane resin foam is made is put into a reaction vessel, thereafter a chain extender is mixed into the reaction vessel, the mixture is agitated, thereafter the mixture is cast into a mold with a predetermined size to thereby prepare a block and the block is sliced with a slicer like a planer or a band saw; and in another of which in the step of casting into the mold, a thin sheet may be directly produced. Besides, a still another way may be adopted in which a resin of raw material is melted, the melt is extruded through a T die to thereby mold a polyurethane resin foam directly in the shape of a sheet.

In addition, as the method for manufacturing a polyurethane resin foam, known methods such as a mechanical foaming method and a chemical foaming method may be used in combination. In particular, the mechanical foaming method using a silicone-based surfactant formed of a polyalkylsiloxane/polyether copolymer is preferably used in combination. As the silicone-based surfactant, SH-192 and L-5340 (manufactured by Toray Dow Corning Silicone Co., Ltd.), and the like can be exemplified as a suitable compound.

An example of a method for manufacturing a thermosetting polyurethane resin foam of a fine cell type using a mechanical foaming method in combination will be described below. The method for manufacturing such a polyurethane resin foam has the following steps.

1) Foaming Step of Preparing Cell Dispersion Liquid

Hollow microspheres are added to a first component containing an isocyanate-terminated prepolymer to a concentration of 1.5 to 2.5% by weight of the polyurethane resin foam, and a silicone-based surfactant is added to the first component to a concentration of 0.05 to 10% by weight of the polyurethane resin foam. The mixture is stirred in the presence of a non-reactive gas, and the non-reactive gas is dispersed as fine cells to prepare a cell dispersion liquid. When the prepolymer is in a solid form at normal temperature, the prepolymer is used after being melted by pre-heating to an appropriate temperature.

2) Mixing Step of Curing Agent (Chain Extender)

A second component containing a chain extender is added to the cell dispersion liquid, followed by mixing and stirring to obtain a foaming reaction liquid.

3) Casting Step

The foaming reaction liquid is poured into a mold.

4) Curing Step

The foaming reaction liquid poured into the mold is reaction-cured by heating.

The non-reactive gas used for forming fine cells is preferably not combustible, and is specifically nitrogen, oxygen, a carbon dioxide gas, a rare gas such as helium and argon, and a mixed gas thereof, and the air dried to remove water is most preferable in respect of cost.

As a stirrer for dispersing the silicone-based surfactant-containing first component to form fine cells with the non-reactive gas, known stirrers can be used without particular limitation, and examples thereof include a homogenizer, a dissolver, a twin-screw planetary mixer etc. The shape of a stirring blade of the stirrer is not particularly limited either, but a whipper-type stirring blade is preferably used to form fine cells.

In a preferable mode, different stirrers are used in stirring for forming a cell dispersion liquid in the stirring step and in stirring for mixing an added chain extender in the mixing step, respectively. In particular, stirring in the mixing step may not be stirring for forming cells, and a stirrer not generating large cells is preferably used. Such a stirrer is preferably a planetary mixer. The same stirrer may be used in the stirring step and the mixing step, and stirring conditions such as revolution rate of the stirring blade are preferably regulated as necessary.

In the method of producing the polyurethane resin foam, heating and post-curing of the foam obtained after casting and reacting the forming reaction liquid in a mold until the dispersion lost fluidity are effective in improving the physical properties of the foam, and are extremely preferable. The forming reaction liquid may be cast in a mold and immediately post-cured in a heating oven, and even under such conditions, heat is not immediately conducted to the reactive components, and thus the diameters of cells are not increased. The curing reaction is conducted preferably at normal pressures to stabilize the shape of cells.

In the production of the polyurethane resin foam, a known catalyst promoting polyurethane reaction, such as tertiary amine-based catalysts, may be used. The type and amount of the catalyst added are determined in consideration of flow time in casting in a predetermined mold after the mixing step.

Production of the polyurethane resin foam may be in a batch system where each component is weighed out, introduced into a vessel and mixed or in a continuous production system where each component and a non-reactive gas are continuously supplied to, and stirred in, a stirring apparatus and the resulting forming reaction liquid is transferred to produce molded articles.

A manufacturing method of a polishing pad may be performed in ways: in one of which a prepolymer which is a raw material from which a polyurethane resin foam is made is put into a reaction vessel, thereafter a chain extender is mixed into the prepolymer, the mixture is agitated, thereafter the mixture is cast into a mold with a predetermined size to thereby prepare a block and the block is sliced with a slicer like a planer or a band saw; and in another of which in the step of casting into the mold, a thin sheet may be directly produced.

The polyurethane resin foam of the first aspect of the present invention mainly has closed cells that are substantially spherical, and the closed cell rate is preferably equal to or more than 70%, more preferably equal to or more than 80%.

The average cell diameter of the polyurethane resin foam of the first aspect of the present invention is preferably 20 to 300 μm, more preferably 35 to 200 μm. If the average cell diameter is out of this range, the planarity (flatness) of the object to be polished after polishing tends to be reduced.

The specific gravity of the polyurethane resin foam of the first aspect of the present invention is preferably 0.5 to 1.0. If the specific gravity is less than 0.5, there is a tendency such that the surface strength of the polishing layer is reduced to decrease the planarity of the object to be polished. In addition, if the specific gravity is greater than 1.0, there is a tendency such that the number of cells on the surface of the polishing layer is reduced, and the polishing rate is decreased though the planarity is good.

The hardness of the polyurethane resin foam of the first aspect of the present invention as measured with an Asker D hardness meter is preferably 25 to 70 degrees. If the Asker D hardness is less than 25 degrees, the planarity of the object to be polished is reduced, while if it exceeds 70 degrees, the planarity is good, but the uniformity (homogeneity) of the object to be polished tends to be deteriorated.

The average cell diameter of the hollow microspheres in the polyurethane resin foam of the second aspect of the present invention is preferably 20 to 60 μm, more preferably 30 to 50 μm.

The average cell diameter of cells formed by the mechanical foaming method in the polyurethane resin foam of the second aspect of the present invention is preferably 20 to 70 μm, more preferably 30 to 60 μm. Further, the closed cell rate in the cells described above is preferably 70% or more, more preferably 80% or more.

The specific gravity of the polyurethane resin foam of the second aspect of the present invention is preferably 0.5 to 0.95. If the specific gravity is less than 0.5, there is a tendency such that the surface strength of the polishing layer is reduced to decrease the planarity of the object to be polished. On the other hand, if the specific gravity is greater than 0.95, the number of bubbles on the surface of the polishing layer is reduced, and the polishing rate tends to decrease though the planarity is good.

The hardness of the polyurethane resin foam of the second aspect of the present invention as measured with an Asker D hardness meter is preferably 25 to 70 degrees. If the Asker D hardness is less than 25 degrees, the planarity of the object to be polished is reduced, while if it exceeds 70 degrees, the planarity is good, but the uniformity (homogeneity) of the object to be polished tends to be deteriorated.

In the third aspect of the present invention, production of a polyurethane resin is performed by mixing a first component containing an isocyanate group-containing compound with a second component containing an active hydrogen group-containing compound, followed by curing. In the prepolymer method, the isocyanate group-containing compound is an isocyanate-terminated prepolymer, and the active hydrogen group-containing compound is a chain extender, or the like. In the one-shot method, the isocyanate group-containing compound is an isocyanate component, and the active hydrogen group-containing compound is a chain extender, a polyol component, or the like.

The polyurethane resin foam that is a material for forming the polishing layer of the third aspect of the present invention can be prepared by a mechanical foaming method (including a mechanical froth method) using a silicon-based surfactant.

A mechanical foaming method using a silicone-based surfactant such as polyalkylsiloxane or a copolymer of alkylsiloxane and polyether alkylsiloxane is particularly preferable. As the silicone-based surfactant, SH-192 and L-5340 (manufactured by Toray Dow Corning Silicone Co., Ltd.), B-8443 and B-8465 (manufactured by Goldschmidt Co., Ltd.), and the like can be mentioned as preferable compounds.

The silicone-based surfactant is added to the polyurethane resin foam preferably in an amount of 0.1 to 10% by weight, more preferably in an amount of 0.5 to 7% by weight.

Various additives may be mixed; such as a stabilizer including an antioxidant, a lubricant, a pigment, a filler, an antistatic agent and others.

In the third aspect of the present invention, an example of a method for manufacturing a polyurethane resin foam constituting a polishing layer will be described below. A method for manufacturing such a polyurethane resin foam includes the following steps.

(1) The first component wherein a silicon-based surfactant is added to an isocyanate-terminated prepolymer produced by an isocyanate component with a high molecular weight polyol or the like is mechanically stirred in the presence of an unreactive gas, to disperse the unreactive gas as fine cells thereby forming a cell dispersion liquid. Then, the second component containing a chain extender and the like is added to, and mixed with, the cell dispersion liquid to prepare a cell dispersed urethane composition. If necessary, a catalyst may be added to the second component.

(2) A silicon-based surfactant is added to the first component containing an isocyanate component (or an isocyanate-terminated prepolymer) and/or the second component containing active hydrogen-containing compounds, and the component (s) to which the silicon-based surfactant is added is mechanically stirred in the presence of an unreactive gas, to disperse the unreactive gas as fine cells thereby forming a cell dispersion liquid. Then, the remaining component is added to, and mixed with, the cell dispersion liquid to prepare a cell dispersed urethane composition.

(3) A silicon-based surfactant is added to at least either of the first component containing an isocyanate component (or an isocyanate-terminated prepolymer) or the second component containing active hydrogen-containing compounds, and the first and second components are mechanically stirred in the presence of an unreactive gas, to disperse the unreactive gas as fine cells thereby preparing a cell dispersed urethane composition.

When the prepolymer method is used, the aromatic compound that has been reacted with the isocyanate component in advance may be incorporated into the structure of the isocyanate-terminated prepolymer, or may be added to the second component.

In the case of the one-shot method, the aromatic compound may be added to the first component, may be added to the second component, or may be added to both the components.

Alternatively, the cell dispersed urethane composition may be prepared by a mechanical frothing method. The mechanical frothing method is a method wherein starting components are introduced into a mixing chamber, while an unreactive gas is mixed therein, and the mixture is mixed under stirring with a mixer such as an Oaks mixer thereby dispersing the unreactive gas in a fine-cell state in the starting mixture. The mechanical frothing method is a preferable method because a density of the polyurethane resin foam can be easily adjusted by regulating the amount of an unreactive gas mixed therein.

In addition, the efficiency of production is high because the polyurethane resin foam having roughly spherical fine cells can be continuously formed.

The unreactive gas used for forming fine cells is preferably not combustible, and is specifically nitrogen, oxygen, a carbon dioxide gas, a rare gas such as helium and argon, and a mixed gas thereof, and the air dried to remove water is most preferable in respect of cost.

As a stirring device for dispersing an unreactive gas in a fine-cell state, any known stirring deices can be used without particular limitation, and specific examples include a homogenizer, a dissolver, a twin-screw planetary mixer, a mechanical froth foaming machine etc. The shape of a stirring blade of the stirring device is not particularly limited, and a whipper-type stirring blade is preferably used to form fine cells. For obtaining the intended polyurethane foam, the number of revolutions of the stirring blade is preferably 500 to 2000 rpm, more preferably 800 to 1500 rpm. The stirring time is suitably regulated depending on the intended density.

In a preferable mode, different stirring devices are used for preparing a cell dispersion liquid in the foaming process and for stirring the first and the second components to mix them, respectively. Stirring in the mixing step may not be stirring for forming cells, and a stirring device not generating large cells is preferably used in the mixing step. Such a stirring device is preferably a planetary mixer. The same stirring device may be used in the foaming step of preparing a cell dispersion liquid and in the mixing step of mixing the respective components, and stirring conditions such as a revolution rate of the stirring blade are preferably regulated according to necessary.

After that, the cell dispersed urethane composition prepared by the method described above is applied onto a release sheet, and the cell dispersed urethane composition is cured to form a polyurethane resin foam.

In addition, the cell dispersed urethane composition prepared by the method described above is applied onto a base material layer or a cushion layer, and the cell dispersed urethane composition is cured to form a polyurethane resin foam (polishing layer) directly on the base material layer or cushion layer.

The base material layer is not particularly limited, and examples include a plastic film such as polypropylene, polyethylene, polyester and polyvinyl chloride, a polymer resin foam such as polyurethane foam and polyethylene foam, rubber-like resin such as butadiene rubber and isoprene rubber, and photosensitive resin. Among these materials, a plastic film such as polypropylene, polyethylene, polyester, polyamide and polyvinyl chloride and a polymer resin foam such as polyurethane foam and polyethylene foam are preferably used. A double-sided tape, or a single-sided pressure-sensitive adhesive tape (a pressure-sensitive adhesive layer on one side is stuck to a platen), may be used as the base material layer.

The base material layer preferably has hardness equal to or higher than that of the polyurethane resin foam in order to confer toughness on the polishing pad. The thickness of the base material layer (or the thickness of the base material in the case of a double-sided tape and a single-sided pressure-sensitive adhesive tape) is not particularly limited, but is preferably 20 to 1000 μm, more preferably 50 to 800 μm from the viewpoint of strength and flexibility.

The cushion layer compensates for characteristics of the polishing layer. The cushion layer is required for satisfying both planarity and uniformity which are in a tradeoff relationship in CMP. Planarity refers to flatness of a pattern region upon polishing an object of polishing having fine unevenness generated upon pattern formation, and uniformity refers to the uniformity of the whole of an object of polishing. Planarity is improved by the characteristics of the polishing layer, while uniformity is improved by the characteristics of the cushion layer.

The material forming the cushion layer is not particularly limited, and examples of such material include a nonwoven fabric such as a polyester nonwoven fabric, a nylon nonwoven fabric or an acrylic nonwoven fabric, a nonwoven fabric impregnated with resin such as a polyester nonwoven fabric impregnated with polyurethane, polymer resin foam such as polyurethane foam and polyethylene foam, rubber resin such as butadiene rubber and isoprene rubber, and photosensitive resin.

A method of applying the cell dispersed urethane composition onto a base material layer can make use of coating methods using, for example, roll coaters such as a gravure coater, kiss-roll coater and comma coater, die coaters such as a slot coater and fountain coater, and a squeeze coater, a curtain coater etc., and any methods can be used insofar as a uniform coating film can be formed on a base material layer.

Post curing by heating the polyurethane resin foam formed by applying the cell dispersed urethane composition onto a base material layer and then reacting the composition until it does not flow has an effect of improving the physical properties of the polyurethane resin foam and is thus extremely preferable. Post curing is carried out preferably at 30 to 80° C. for 10 minutes to 6 hours and conducted preferably at normal pressures in order to stabilize the shape of cells.

In the production of the polyurethane resin foam, known catalysts promoting a polyurethane reaction, such as tertiary amine-based catalysts, may be used. The type and amount of the catalyst added are determined in consideration of flow time for application onto a base material layer after the step of mixing the respective components.

Production of the polyurethane resin foam may be carried out in a batch system wherein the respective components are weighed, introduced into a container, and mechanically stirred, or in a continuous production system wherein the respective components and an unreactive gas are continuously fed to a stirring device and mechanically stirred, and the resulting cell dispersed urethane composition is sent onto abase material layer to form a product.

It is necessary that the thickness of the polyurethane resin foam is uniformly regulated after or while the polyurethane resin foam is formed on a base material layer. A method of uniformly regulating the thickness of the polyurethane resin foam includes, but is not limited to, a method of buffing the polyurethane resin foam with an abrasive, a method of pressing it with a pressing plate, etc.

The cell dispersed urethane composition prepared by the method described above is applied onto a base material layer, and a release sheet is laminated on the cell dispersed urethane composition. Thereafter, the cell dispersed urethane composition may be cured to form a polyurethane resin foam while the thickness thereof is made uniform with a pressing means.

On the other hand, the cell dispersed urethane composition prepared by the method described above is applied onto a release sheet, and a base material layer is laminated on the cell dispersed urethane composition. Thereafter, the cell dispersed urethane composition may be cured to form a polyurethane foam while the thickness thereof is made uniform with a pressing means.

A material for forming the release sheet is not particularly limited, and can include general resins and paper. The release sheet is preferably a sheet with small dimensional change caused by heating. Further, the surface of the release sheet may have been subjected to release treatment.

A pressing means for pressing a sandwich sheet made of the base material layer, the cell dispersed urethane composition (cell dispersed urethane layer) and the release sheet to make the thickness of the sandwich sheet uniform is not particularly limited, and for example, a method of pressing it to a predetermined thickness with a coater roll, a nip roll or the like. In considering the fact that, after compression, the size of cells in the foam is increased about 1.2 to 2 times, it is preferable in compression to satisfy the following equation: (Clearance of a coater or nip)−(thickness of the base material layer and release sheet)=(50 to 85% of the thickness of the polyurethane resin foam after curing).

Then, after the thickness of the sandwich sheet is made uniform, the polyurethane resin foam is reacted under heating until it does not flow, and post-cured to form a polishing layer. The conditions for the post cure are the same as described above.

Thereafter, a release sheet on the upper surface side or the lower surface side of the polyurethane resin foam is separated to obtain a polishing pad. In this case, since a skin layer is formed on the polyurethane resin foam, the skin layer is removed by buffing, or the like. In addition, when the polyurethane resin foam is formed by a mechanical foaming method as described above, variation of the cells is smaller on the lower surface side than on the upper surface side of the polyurethane resin foam. Therefore, when a release sheet on the lower surface side is separated and the lower surface side of the polyurethane resin foam is used as a polishing surface, stability of the polishing rate is more improved because a polishing surface having small variation of the cells is obtained.

In addition, after the polishing layer is formed without forming the polyurethane resin foam (polishing layer) directly on the base material layer or cushion layer, the foam may be stuck onto the base material layer or cushion layer using a double-sided tape or the like.

The polyurethane resin foam of the third aspect of the present invention mainly has interconnected cells that are substantially spherical, and the interconnected cell rate is preferably 60% or more, and more preferably 70% or more.

The average cell diameter of the polyurethane resin foam of the third aspect of the present invention is preferably 20 to 300 μm, more preferably 35 to 200 μm. If the average cell diameter is out of this range, the planarity (flatness) of the object to be polished after polishing tends to be reduced.

The specific gravity of the polyurethane resin foam of the third aspect of the present invention is preferably 0.3 to 0.7, more preferably 0.4 to 0.6. When the specific gravity is less than 0.3, the durability of the polishing layer tends to be deteriorated. When the specific gravity is greater than 0.7, the crosslink density of the material should be lowered to attain a certain modulus of elasticity. In this case, permanent deformation tends to be increased and durability tends to be deteriorated.

The hardness of the polyurethane resin foam of the third aspect of the present invention, as determined by an Asker C hardness meter, is preferably 10 to 95 degrees, more preferably 40 to 90 degrees. When the Asker C hardness is less than 10 degrees, the durability of the polishing layer is reduced, and the surface smoothness of the object to be polished after polishing tends to be deteriorated. On the other hand, when the hardness is greater than 95 degrees, scratches are likely to occur on the surface of the object to be polished.

In case of the fourth aspect of the present invention, the unfoamed polyurethane resin is preferably produced by melting method in view of cost, working environment and so on, while it may be produced by application of any known urethane foaming techniques such as melting method and solution technique. Various additives may be mixed; such as a stabilizer including an antioxidant, a lubricant, a pigment, a filler, an antistatic agent and others.

Manufacture of the unfoamed polyurethane resin is enabled by means of either a prepolymer method or a one shot method, of which preferable is a prepolymer method in which an isocyanate-terminated prepolymer is synthesized from an isocyanate component and a polyol component in advance, with which a chain extender is reacted since physical properties of an obtained polyurethane resin is excellent.

When the prepolymer method is used, the aromatic compound that has been reacted with the isocyanate component in advance may be incorporated into the structure of the isocyanate-terminated prepolymer, or may be added at the time of curing the isocyanate-terminated prepolymer synthesized from an isocyanate component and a polyol component.

A known catalyst promoting polyurethane reaction, such as tertiary amine-based catalysts, may be used. The type and amount of the catalyst added are determined in consideration of flow time in casting in a predetermined mold after the mixing step.

Production of the unfoamed polyurethane resin may be in a batch system where each component is weighed out, introduced into a vessel and mixed or in a continuous production system where each component is continuously supplied to, and stirred in, a stirring apparatus and a polyurethane raw material composition is transferred to produce molded articles.

The hardness of the unfoamed polyurethane resin, as determined by an Asker D hardness meter, is preferably 50 to 70 degrees. If the Asker D hardness is less than 50 degrees, the planarity of the object to be polished tends to be deteriorated. On the other hand, if the hardness is greater than 70 degrees, the planarity is good, but the uniformity (homogeneity) of the object to be polished tends to be deteriorated.

A polishing pad (polishing layer) of the invention is preferably provided with a surface structure for holding and renewing a slurry. The polishing layer formed of the foam has many openings at its polishing surface to have a function of holding and renewing a slurry. A depression and protrusion structure is preferably provided to the polishing surface in order to efficiently achieve further holding and renewal of a slurry or in order to prevent an object to be polished from being broken by adsorption between the polishing pad and the object to be polished. Though in a case where the polishing layer is formed with an unfoamed body, which lacks in work to hold and renew the slurry, a depression and protrusion structure are preferably provided on the surface of the polishing side thereof in order to achieve more of holdability and renewal of the slurry or in order to prevent induction of dechuck error or breakage of an object to be polished. The shape of the depression and protrusion structure is not particularly limited insofar as slurry can be retained and renewed, and examples include latticed grooves, concentric circle-shaped grooves, through-holes, non-through-holes, polygonal prism, cylinder, spiral grooves, eccentric grooves, radial grooves, and a combination of these grooves. The groove pitch, groove width, groove thickness etc. are not particularly limited either, and are suitably determined to form grooves. These depression and protrusion structure are generally those having regularity, but the groove pitch, groove width, groove depth etc. can also be changed at each certain region to make retention and renewal of slurry desirable.

The method of forming the depression and protrusion structure is not particularly limited, and for example, formation by mechanical cutting with a jig such as a bite of predetermined size, formation by casting and curing resin in a mold having a specific surface shape, formation by pressing resin with a pressing plate having a specific surface shape, formation by photolithography, formation by a printing means, and formation by a laser light using a $CO_2$ gas laser or the like.

A polishing pad of the invention may also be a laminate of a polishing layer and a cushion sheet (a cushion layer) adhered to each other.

Means for adhering the polishing layer to the cushion sheet include: for example, a method in which a double sided tape is sandwiched between the polishing layer and the cushion sheet, followed by pressing.

The double sided tape is of a common construction in which adhesive layers are provided on both surfaces of a substrate such as a nonwoven fabric or a film. It is preferable to use a film as a substrate with consideration given to prevention of permeation of a slurry into a cushion sheet. A composition of an adhesive layer is, for example, of a rubber-based adhesive, an acrylic-based adhesive or the like. An acrylic-based adhesive is preferable because of less of a content of metal ions, to which consideration is given. Since a polishing layer and a cushion sheet is sometimes different in composition from each other, different compositions are adopted in respective adhesive layers of double sided tape to thereby also enable adhesive forces of the respective adhesive layers to be adjusted to proper values.

The shape of the polishing pad of the present invention is not particularly limited, and may be a long shape of about several meters in length, or may be a round shape of a diameter of several tens of centimeters.

The thickness of the polishing layer is not particularly limited, and is usually about 0.2 to 4 mm, preferably 0.5 to 2.5 mm, more preferably 0.5 to 1.5 mm.

A polishing pad of the invention may be provided with a double sided tape on the surface of the pad adhered to a platen. As the double sided tape, a tape of a common construction can be used in which adhesive layers are, as described above, provided on both surfaces of a substrate. As the substrate, for example, a nonwoven fabric or a film is used. Preferably used is a film as a substrate since separation from the platen is necessary after the use of a polishing pad. As a composition of an adhesive layer, for example, a rubber-based adhesive or an acrylic-based adhesive is exemplified. Preferable is an acrylic-based adhesive because of less of metal ions in content to which consideration is given.

A semiconductor device is fabricated after operation in a step of polishing a surface of a semiconductor wafer with a polishing pad. The term, a semiconductor wafer, generally means a silicon wafer on which a wiring metal and an oxide layer are stacked. No specific limitation is imposed on a polishing method of a semiconductor wafer or a polishing apparatus, and polishing is performed with a polishing apparatus equipped, as shown in FIG. 1, with a polishing platen 2 supporting a polishing pad (a polishing layer) 1, a polishing head 5 holding a semiconductor wafer 4, a backing material for applying a uniform pressure against the wafer and a supply mechanism of a polishing agent 3. The polishing pad 1 is mounted on the polishing platen 2 by adhering the pad to the platen with a double sided tape. The polishing platen 2 and the polishing head 5 are disposed so that the polishing pad 1 and the semiconductor wafer 4 supported or held by them oppositely face each other and provided with respective rotary shafts 6 and 7. A pressure mechanism for pressing the semiconductor wafer 4 to the polishing pad 1 is installed on the polishing head 5 side. During polishing, the semiconductor wafer 4 is polished by being pressed against the polishing pad 1 while the polishing platen 2 and the polishing head 5 are rotated and a slurry is fed. No specific limitation is placed on a flow rate of the slurry, a polishing load, a polishing platen rotation number and a wafer rotation number, which are properly adjusted.

Protrusions on the surface of the semiconductor wafer 4 are thereby removed and polished flatly. Thereafter, a semiconductor device is produced therefrom through dicing, bonding, packaging etc. The semiconductor device is used in an arithmetic processor, a memory etc.

EXAMPLES

Description will be given of the invention with examples, while the invention is not limited to description in the examples.
[The First Present Invention]
[Measurement and Evaluation Method]
(Measurement of Average Cell Diameter)

The prepared polyurethane resin foam was sliced with a microtome cutter into measurement samples each with the thinnest possible thickness of 1 mm or less. A surface of a sample was photographed with a scanning electron microscope (S-3500N, Hitachi Science Systems Co., Ltd.) at a magnification of ×100. An effective circular diameter of each of all cells in an arbitrary area was measured with an image analyzing soft (manufactured by MITANI Corp. with a trade name WIN-ROOF) and an average cell diameter was calculated from the measured values.

(Measurement of Closed Cell Rate)

First, the interconnected cell rate was measured according to the method of ASTM-2856-94-C. Ten polyurethane resin foam sheets punched into a circular form were piled and used as a measurement sample. As a measuring instrument, an air pycnometer 930 (manufactured by Beckman Instruments Inc.) was used. The interconnected cell rate was calculated according to the following equation:

$$\text{Interconnected cell rate}(\%) = [(V-V1)/V] \times 100$$

wherein V is an apparent volume ($cm^3$) calculated from the sample dimension and V1 is a sample volume ($cm^3$) measured by using the air pycnometer.

Then, the closed cell rate was calculated according to the following equation:

$$\text{Closed cell rate}(\%) = 100 - (\text{Interconnected cell rate}).$$

(Measurement of Specific Gravity)

Determined according to JIS Z8807-1976. A manufactured polyurethane resin foam cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd).

(Measurement of Hardness)

Measurement is conducted according to JIS K6253-1997. A manufactured polyurethane resin foam cut out in a size of 2 cm×2 cm (thickness: arbitrary) was used as a sample for measurement of hardness and left for 16 hours in an environment of a temperature of 23±2° C. and a humidity of 50%±5%. At the time of measurement, samples were stuck on one another to a thickness of 6 mm or more. A hardness meter (Asker D hardness meter, manufactured by Kobunshi Keiki Co., Ltd.) was used to measure hardness.

(Measurement of Storage Elastic Modulus)

A dynamic viscoelasticity meter (DMA861e, manufactured by Mettler-Toledo International Inc.) was used to measure the storage elastic modulus E' at 40° C. (40° C.) of the prepared polyurethane resin foam under the following conditions.
Frequency: 1.6 Hz
Rate of temperature rise: 2.0° C./minute
Measurement temperature range: 0 to 60° C.
Sample shape: 19.5 mm in length, 3.0 mm in width, and 1.0 mm in thickness
(Measurement of Cut Rate)

The polishing pad prepared was stuck to a double-sided polishing machine (model 9B, manufactured by SpeedFam Co., Ltd.). Using 4 sheets of diamond dresser (#100 specification, with 24 diamond pellets, manufactured by SpeedFam Co., Ltd.), the surface of the polishing pad was dressed uniformly while rotating. In the dressing, the conditions were such that the dressing load was 100 g/cm$^2$, the rotation speed of the polishing platen was 50 rpm, and the dressing time was 20 minutes. The cut rate (μm/min) was calculated from the thickness of the polishing pad before and after dressing.

Production Example 1

Synthesis of Prepolymer

To a vessel were added 1229 parts by weight of toluene diisocyanate (a mixture of toluene 2,4-diisocyanate/toluene 2,6-diisocyanate=80/20), 272 parts by weight of 4,4'-dicyclohexylmethane diisocyanate, 1901 parts by weight of polytetramethylene ether glycol having a number average molecular weight of 1018, and 198 parts by weight of diethylene glycol, and the mixture was allowed to react at 70° C. for 4 hours to obtain an isocyanate-terminated prepolymer A (NCO concentration: 2.22 meq/g).

Similarly, 204 parts by weight of toluene diisocyanate (a mixture of toluene 2,4-diisocyanate/toluene 2,6-diisocyanate=80/20) and 596 parts by weight of polytetramethylene ether glycol having a number average molecular weight of 1018 were charged into a vessel, and the contents were allowed to react at 70° C. for 4 hours to obtain an isocyanate-terminated prepolymer B (NCO concentration: 1.48 meq/g).

Example 1

To a reaction vessel were added 100 parts by weight of the isocyanate-terminated prepolymer A, 2.4 parts by weight (0.080 equivalent of hydroxyl group per 1 equivalent of isocyanate group) of ethylene glycol monophenyl ether, and 3 parts by weight of a silicone-based surfactant (B-8465, manufactured by Goldschmidt Co., Ltd.), and the contents were mixed. The mixture was adjusted to 80° C. and defoamed under reduced pressure. Subsequently, the mixture was vigorously stirred with a stirring blade at the rotation speed of 900 rpm for about 4 minutes in such a manner that air bubbles were incorporated into the reaction system. To the resulting mixture was added 24.1 parts by weight of 4,4'-methylenebis(o-chloroaniline) (IHARACUAMINE-MT, manufactured by Ihara Chemical Industry Co., Ltd.), which had been previously melted at 120° C. The liquid mixture was stirred for about 1 minute and then poured into a loaf-shaped open mold (casting vessel). At the point when the liquid mixture lost its fluidity, it was placed in an oven, and subjected to post curing at 110° C. for 6 hours, so that a polyurethane resin foam block was obtained.

The polyurethane resin foam block heated to about 80° C. was sliced using a slicer (VGW-125, manufactured by AMITEC Corporation), so that a polyurethane resin foam sheet was obtained. Subsequently, the surface of the sheet was buffed using a buffing machine (manufactured by AMITEC Corporation) until its thickness reached 1.27 mm, thereby to obtain a sheet with regulated thickness accuracy. The buffed sheet was punched into a piece with a diameter of 61 cm. Concentric circular grooves with a width of 0.25 mm, a pitch of 1.50 mm, and a depth of 0.40 mm were formed on the polishing surface of the piece using a grooving machine (manufactured by Techno Corporation), so that a polishing sheet (polishing layer) was obtained. A double-sided adhesive tape (Double Tack Tape, manufactured by Sekisui Chemical Co., Ltd.) was stuck onto the surface of the polishing sheet opposite to the grooved surface using a laminator. Further, the surface of a corona-treated cushion sheet (TORAYPEF (0.8 mm-thick polyethylene foam), manufactured by Toray Industries, Inc.) was buffed. The buffed cushion sheet was stuck onto the double-sided adhesive tape using a laminator. Another double-sided adhesive tape was also stuck onto the other side of the cushion sheet using a laminator so that a polishing pad was prepared.

Examples 2 to 8 and Comparative Example 1

Polishing pads were prepared in the same manner as in Example 1, except that the compositions described in Table 1 were used. The compounds shown in Table 1 are as follows.
Prepolymer A (NCO concentration: 2.22 meq/g)
Prepolymer B (NCO concentration: 1.48 meq/g)
N3300: Polymerized 1,6-hexamethylene diisocyanate (SUMIDUR N3300, isocyanurate type, manufactured by Sumika Bayer Urethane Co., Ltd.)
MOCA: 4,4'-Methylenebis(o-chloroaniline) (IHARACUAMINE-MT, manufactured by Ihara Chemical Industry Co., Ltd.)
PhG: Ethylene glycol monophenyl ether (manufactured by Nippon Nyukazai Co., Ltd.)
PhDG: Diethylene glycol monophenyl ether (manufactured by Nippon Nyukazai Co., Ltd.)
PhFG: Propylene glycol monophenyl ether (manufactured by Nippon Nyukazai Co., Ltd.)
B8465: Silicone-based surfactant (B8465, manufactured by Goldschmidt Co., Ltd.)

TABLE 1

| | | Example 1 | Example 2 | Example 3 | Example 4 | Example 5 | Example 6 | Example 7 | Example 8 | Comparative Example 1 |
|---|---|---|---|---|---|---|---|---|---|---|
| Prepolymer | Prepolymer A (Parts by weight) | 100 | 100 | 100 | 95 | 85 | 100 | 100 | 35 | 100 |
| | Prepolymer B (Parts by weight) | | | | | | | | 35 | |
| Polymerized diisocyanate | N3300 (Parts by weight) | | | | 5 | 15 | | | 30 | |

TABLE 1-continued

|  |  | Example 1 | Example 2 | Example 3 | Example 4 | Example 5 | Example 6 | Example 7 | Example 8 | Comparative Example 1 |
|---|---|---|---|---|---|---|---|---|---|---|
| Curing agent | MOCA (Parts by weight) | 24.1 | 20.5 | 24.6 | 25.8 | 29.2 | 24.3 | 23.1 | 28.8 | 26.5 |
|  | PhG (Parts by weight) [Equivalent] | 2.4[0.080] | 6.2[0.206] |  | 2.6[0.081] | 2.9[0.080] |  |  | 5.8[0.148] |  |
|  | PhDG (Parts by weight) [Equivalent] |  |  | 2.5[0.063] |  |  |  |  |  |  |
|  | PhFG (Parts by weight) [Equivalent] |  |  |  |  |  | 2.4[0.073] |  |  |  |
|  | Aniline (Parts by weight) [Equivalent] |  |  |  |  |  |  | 2.3[0.113] |  |  |
| Silicone-based surfactant | B8465 (Parts by weight) | 3 | 3 | 3 | 3 | 3 | 3 | 3 | 3 | 3 |
| Physical properties | Average cell diameter (μm) | 43.5 | 44.7 | 47.3 | 45.1 | 43.8 | 49.6 | 44.2 | 47.8 | 43.5 |
|  | Closed cell rate (%) | 83.4 | 82.6 | 81.5 | 86.2 | 84.3 | 81.8 | 84.3 | 82.9 | 88.6 |
|  | Specific gravity | 0.709 | 0.712 | 0.712 | 0.694 | 0.697 | 0.703 | 0.705 | 0.689 | 0.700 |
|  | D hardness (degree) | 40 | 32 | 38 | 41 | 45 | 39 | 43 | 38 | 47 |
|  | Storage elastic modulus E' (40° C.) (MPa) | 175 | 110 | 135 | 187 | 270 | 147 | 224 | 143 | 284 |
|  | Cut rate (μ/min) | 4.5 | 9.1 | 4.3 | 5.2 | 8.6 | 4.3 | 4.4 | 9.3 | 2.3 |

[The Second Present Invention]
[Measurement and Evaluation Method]
(Measurement of Average Cell Diameter)

The prepared polyurethane resin foam was sliced with a microtome cutter into measurement samples each with the thinnest possible thickness of 1 mm or less. A surface of a sample was photographed with a scanning electron microscope (S-3500N, Hitachi Science Systems Co., Ltd.) at a magnification of ×100. An effective circular diameter of each of all cells in an arbitrary area was measured with an image analyzing soft (manufactured by MITANI Corp. with a trade name WIN-ROOF) and an average cell diameter was calculated from the measured values.

(Measurement of Specific Gravity)

Determined according to JIS Z8807-1976. A manufactured polyurethane resin foam cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd.).

(Measurement of Hardness)

Measurement is conducted according to JIS K6253-1997. A manufactured polyurethane resin foam cut out in a size of 2 cm×2 cm (thickness: arbitrary) was used as a sample for measurement of hardness and left for 16 hours in an environment of a temperature of 23±2° C. and a humidity of 50%±5%. At the time of measurement, samples were stuck on one another to a thickness of 6 mm or more. A hardness meter (Asker D hardness meter, manufactured by Kobunshi Keiki Co., Ltd.) was used to measure hardness.

(Measurement of Cut Rate)

The polishing pad prepared was stuck to a double-sided polishing machine (model 9B, manufactured by SpeedFam Co., Ltd.). Using 4 sheets of diamond dresser (#100 specification, with 24 diamond pellets, manufactured by SpeedFam Co., Ltd.), the surface of the polishing pad was dressed uniformly while rotating. In the dressing, the conditions were such that the dressing load was 100 g/cm², the rotation speed of the polishing platen was 50 rpm, and the dressing time was 20 minutes. The cut rate (μm/min) was calculated from the thickness of the polishing pad before and after dressing.

Production Example 1

Synthesis of Prepolymer

To a vessel were added 1229 parts by weight of toluene diisocyanate (a mixture of toluene 2,4-diisocyanate/toluene 2,6-diisocyanate=80/20), 272 parts by weight of 4,4'-dicyclohexylmethane diisocyanate, 1901 parts by weight of polytetramethylene ether glycol having a number average molecular weight of 1018, and 198 parts by weight of diethylene glycol, and the mixture was allowed to react at 70° C. for 4 hours to obtain an isocyanate-terminated prepolymer A (NCO concentration: 2.22 meq/g).

Example 1

To a reaction vessel were added 100 parts by weight of the isocyanate-terminated prepolymer A which had been adjusted to 70° C. and defoamed under reduced pressure, 2.4 parts by weight (0.080 equivalent of hydroxyl group per 1 equivalent of isocyanate group) of ethylene glycol monophenyl ether, and 3.0 parts by weight of hollow microspheres (Matsumoto Microsphere F-105, average cell diameter of 35 μm, manufactured by Matsumoto Yushi-Seiyaku Co., Ltd.). The mixture was stirred with a hybrid mixer (manufactured by KEYENCE CORPORATION) for 3 minutes. The resulting liquid mixture was defoamed for 1 hour at 70° C. under reduced pressure to obtain a dispersion liquid, to which was added 24.1 parts by weight of 4,4'-methylenebis(o-chloroaniline) that had been previously melted at 120° C. The mixture was stirred with a hybrid mixer for 1 minute to prepare a reaction liquid, which was then poured into a loaf-shaped open mold (casting vessel). At the point when the mixture lost its fluidity, it was placed in an oven, and subjected to post curing at 100° C. for 16 hours, so that a polyurethane resin foam block was obtained.

The polyurethane resin foam block heated to about 80° C. was sliced using a slicer (VGW-125, manufactured by AMITEC Corporation), so that a polyurethane resin foam sheet was obtained. Subsequently, the surface of the sheet was buffed using a buffing machine (manufactured by AMITEC Corporation) until its thickness reached 1.27 mm, thereby to obtain a sheet with regulated thickness accuracy. The buffed sheet was punched into a piece with a diameter of 61 cm.

Concentric circular grooves with a width of 0.25 mm, a pitch of 1.50 mm, and a depth of 0.40 mm were formed on the polishing surface of the piece using a grooving machine (manufactured by Techno Corporation), so that a polishing sheet (polishing layer) was obtained. A double-sided adhesive tape (Double Tack Tape, manufactured by Sekisui Chemical Co., Ltd.) was stuck onto the surface of the polishing sheet opposite to the grooved surface using a laminator. Further, the surface of a corona-treated cushion sheet (TORAYPEF (0.8 mm-thick polyethylene foam), manufactured by Toray Industries, Inc.) was buffed and the buffed cushion sheet was stuck onto the double-sided adhesive tape using a laminator. Another double-sided adhesive tape was also stuck onto the other side of the cushion sheet using a laminator so that a polishing pad was prepared.

Examples 2 to 8 and Comparative Example 1

Polishing pads were prepared in the same manner as in Example 1, except that the compositions described in Table 1 were used. The compounds shown in Table 1 are as follows.
Prepolymer A (NCO concentration: 2.22 meq/g)
N3300: Polymerized 1,6-hexamethylene diisocyanate (SUMIDUR N-3300, isocyanurate type, manufactured by Sumika Bayer Urethane Co., Ltd.)
MOCA: 4,4'-Methylenebis(o-chloroaniline) (IHARACUAMINE-MT, manufactured by Ihara Chemical Industry Co., Ltd.)
PhG: Ethylene glycol monophenyl ether (manufactured by Nippon Nyukazai Co., Ltd.)
PhDG: Diethylene glycol monophenyl ether (manufactured by Nippon Nyukazai Co., Ltd.)
PhFG: Propylene glycol monophenyl ether (manufactured by Nippon Nyukazai Co., Ltd.)
F105: Hollow microspheres (Matsumoto Microsphere F-105, average cell diameter of 35 μm, manufactured by Matsumoto Yushi-Seiyaku Co., Ltd.)

[The Third Present Invention]
[Measurement and Evaluation Method]
(Measurement of Average Cell Diameter)

The prepared polyurethane resin foam was sliced with a microtome cutter into measurement samples each with the thinnest possible thickness of 1 mm or less. A surface of a sample was photographed with a scanning electron microscope (S-3500N, Hitachi Science Systems Co., Ltd.) at a magnification of ×100. An effective circular diameter of each of all cells in an arbitrary area was measured with an image analyzing soft (manufactured by MITANI Corp. with a trade name WIN-ROOF) and an average cell diameter was calculated from the measured values. In the case of an oval sphere-shaped cell, its cell diameter was expressed as the diameter of a circular cell equivalent in area to the oval sphere-shaped cell.

(Measurement of Interconnected Cell Rate)

The interconnected cell rate was measured according to the method of ASTM-2856-94-C. Ten polyurethane resin foams punched into a circular form were piled and used as a measurement sample. As a measuring instrument, an air pycnometer 930 (manufactured by Beckman Instruments Inc.) was used. The interconnected cell rate was calculated according to the following equation:

$$\text{Interconnected cell rate}(\%) = [(V - V1)/V] \times 100$$

wherein V is an apparent volume ($cm^3$) calculated from the sample dimension and V1 is a sample volume ($cm^3$) measured using the air pycnometer.

(Measurement of Specific Gravity)

Determined according to JIS Z8807-1976. A manufactured polyurethane resin foam cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd).

TABLE 2

| | | Example 1 | Example 2 | Example 3 | Example 4 | Example 5 | Example 6 | Example 7 | Example 8 | Comparative Example 1 |
|---|---|---|---|---|---|---|---|---|---|---|
| Prepolymer | Prepolymer A (Parts by weight) | 100 | 100 | 100 | 95 | 85 | 85 | 100 | 100 | 100 |
| Polymerized diisocyanate | N3300 (Parts by weight) | | | | 5 | 15 | 15 | | | |
| Curing agent | MOCA (Parts by weight) | 24.1 | 20.5 | 24.6 | 25.8 | 29.2 | 29.2 | 24.3 | 23.1 | 26.5 |
| | PhG (Parts by weight) [Equivalent] | 2.4[0.080] | 6.2[0.206] | | 2.6[0.081] | 2.9[0.080] | 2.9[0.080] | | | |
| | PhDG (Parts by weight) [Equivalent] | | | 2.5[0.063] | | | | | | |
| | PhFG (Parts by weight) [Equivalent] | | | | | | | | 2.4[0.073] | |
| | Aniline (Parts by weight) [Equivalent] | | | | | | | | 2.3[0.113] | |
| Hollow microspheres | F105 (parts by weight) (% by weight) | 3.0[2.3] | 3.0[2.3] | 3.0[2.3] | 3.0[2.3] | 3.1[2.3] | 2.4[1.8] | 3.0[2.3] | 2.9[2.3] | 3.0[2.3] |
| Physical properties | Average cell diameter (μm) | 35 | 35 | 35 | 35 | 35 | 35 | 35 | 35 | 35 |
| | Specific gravity | 0.812 | 0.803 | 0.809 | 0.799 | 0.801 | 0.876 | 0.793 | 0.800 | 0.800 |
| | D hardness (degree) | 45 | 38 | 43 | 46 | 50 | 60 | 44 | 48 | 52 |
| | Cut rate (μ/min) | 4.2 | 8.8 | 4.1 | 4.9 | 8.3 | 7.4 | 4.0 | 4.2 | 2.1 |

(Measurement of Hardness)

The hardness was measured in accordance with JIS K-7312. The prepared polyurethane resin foam was cut into samples with a size of 5 cm×5 cm (with arbitrary thickness), and the samples were left for 16 hours in an environment of a temperature of 23° C.±2° C. and a humidity of 50%±5%. In the measurement of the hardness, the samples were piled up to a thickness of 10 mm or more. A hardness meter (Asker C hardness meter, pressurized surface height 3 mm, manufactured by Kobunshi Keiki Co., Ltd.) was contacted with a pressurized surface, and the hardness was measured 60 seconds later.

(Measurement of Storage Elastic Modulus)

A dynamic viscoelasticity meter (DMA861e, manufactured by Mettler-Toledo International Inc.) was used to measure the storage elastic modulus E' at 40° C. (40° C.) of the prepared polyurethane resin foam under the following conditions.

Frequency: 1.6 Hz
Rate of temperature rise: 2.0° C./minute
Measurement temperature range: 0 to 60° C.
Sample shape: 19.5 mm in length, 3.0 mm in width, and 1.0 mm in thickness (Measurement of Cut Rate)

The polishing pad prepared was stuck to a double-sided polishing machine (model 9B, manufactured by SpeedFam Co., Ltd.). Using 4 sheets of diamond dresser (#100 specification, with 24 diamond pellets, manufactured by SpeedFam Co., Ltd.), the surface of the polishing pad was dressed uniformly while rotating. In the dressing, the conditions were such that the dressing load was 100 g/cm², the rotation speed of the polishing platen was 50 rpm, and the dressing time was 20 minutes. The cut rate (μm/min) was calculated from the thickness of the polishing pad before and after dressing.

Example 1

To a vessel were added 60 parts by weight of polycaprolactone diol (PCL210N, number of functional groups: 2, hydroxyl value: 110 mg KOH/g, manufactured by Daicel Chemical Industries, Ltd.), 25 parts by weight of polycaprolactone triol (PCL305, number of functional groups: 3, hydroxyl value: 305 mg KOH/g, manufactured by Daicel Chemical Industries, Ltd.), 2 parts by weight of trimethylolpropane-propylene oxide adduct (EX-890MP, number of functional groups: 3, hydroxyl value: 865 mg KOH/g, manufactured by Asahi Glass Co., Ltd.), 13 parts by weight of diethylene glycol (DEG, number of functional groups: 2, hydroxyl value: 1058 mg KOH/g), 10 parts by weight of ethylene glycol monophenyl ether (0.105 equivalent of hydroxyl groups per 1 equivalent of isocyanate groups, manufactured by Nippon Nyukazai Co., Ltd.), 6 parts by weight of a silicone-based surfactant (B8443, manufactured by Goldschmidt Co., Ltd.), and 0.06 parts by weight of a catalyst (Kao No. 25, manufactured by Kao Corporation), and these additives were mixed. The reaction system was vigorously stirred for about 4 minutes with a stirring blade at a rotation speed of 900 rpm so that air bubbles were incorporated into the reaction system. Thereafter, 95.88 parts by weight of MILLIONATE MTL (manufactured by Nippon Polyurethane Industry Co., Ltd.) was added, and the mixture was stirred for about 1 minute to prepare a cell-dispersed urethane composition.

The cell-dispersed urethane composition prepared was applied to a release sheet (polyethylene terephthalate, 0.1 mm in thickness, manufactured by TOYOBO Co., Ltd.) which had undergone a release treatment, so that a cell-dispersed urethane layer was formed on the sheet. The cell-dispersed urethane layer was then covered with a base material layer (polyethylene terephthalate, 0.2 mm in thickness). The cell-dispersed urethane layer was pressed into a thickness of 1.2 mm with nip rollers and then cured at 70° C. for 3 hours, so that a polyurethane resin foam was formed. The release sheet was then peeled off from the polyurethane resin foam. Using a band saw-type slicer (manufactured by Fecken), the surface of the polyurethane resin foam was sliced, so that its thickness was reduced to 1.0 mm and the thickness precision was controlled. Subsequently, a double-sided adhesive tape (Double Tack Tape, manufactured by Sekisui Chemical Co., Ltd.) was stuck onto the surface of the base material layer using a laminator, thereby to obtain a polishing pad.

Examples 2 to 6 and Comparative Example 1

Polishing pads were prepared in the same manner as in Example 1, except that the compositions described in Table 1 were used. The compounds shown in Table 1 are as follows.

PCL210N: Polycaprolactone diol (number of functional groups: 2, hydroxyl value: 110 mg KOH/g, manufactured by Daicel Chemical Industries, Ltd.)

PTMG1000: Polytetramethylene ether glycol (number of functional groups: 2, hydroxyl value: 112 mg KOH/g, manufactured by Mitsubishi Chemical Corporation)

PCL305: Polycaprolactone triol (number of functional groups: 3, hydroxyl value: 305 mg KOH/g, manufactured by Daicel Chemical Industries, Ltd.)

EX-890MP: Trimethylolpropane-propylene oxide adduct (number of functional groups: 3, hydroxyl value: 865 mg KOH/g, manufactured by Asahi Glass Co., Ltd.)

DEG: Diethylene glycol (number of functional groups: 2, hydroxyl value: 1058 mg KOH/g)

PhG: Ethylene glycol monophenyl ether (manufactured by Nippon Nyukazai Co., Ltd.)

PhDG: Diethylene glycol monophenyl ether (manufactured by Nippon Nyukazai Co., Ltd.)

PhFG: Propylene glycol monophenyl ether (manufactured by Nippon Nyukazai Co., Ltd.)

B8443: Silicone-based surfactant (manufactured by Goldschmidt Co., Ltd.)

Kao No. 25: Catalyst (manufactured by Kao Corporation)

MILLIONATE MTL: Carbodiimide-modified MDI (manufactured by Nippon Polyurethane Industry Co., Ltd.)

TABLE 3

| | | Example 1 | Example 2 | Example 3 | Example 4 | Example 5 | Example 6 | Comparative Example 1 |
|---|---|---|---|---|---|---|---|---|
| Polyol component | PCL210N (Parts by weight) | 60 | 60 | 60 | | 60 | 60 | 60 |
| | PTMG1000 (Parts by weight) | | | | 30 | | | |
| | PCL305 (Parts by weight) | 25 | 25 | 25 | 55 | 25 | 25 | 25 |
| | EX-890MP (Parts by weight) | 2 | 2 | 2 | | 2 | 2 | 2 |
| | DEG (Parts by weight) | 13 | 13 | 13 | 15 | 13 | 13 | 13 |

TABLE 3-continued

|  |  | Example 1 | Example 2 | Example 3 | Example 4 | Example 5 | Example 6 | Comparative Example 1 |
|---|---|---|---|---|---|---|---|---|
| Aromatic compound | PhG (Parts by weight) [Equivalent] | 10[0.105] | 15[0.157] |  | 10[0.105] |  |  |  |
|  | PhDG (Parts by weight) [Equivalent] |  |  | 10[0.08] |  |  |  |  |
|  | PhFG (Parts by weight) [Equivalent] |  |  |  |  | 10[0.08] |  |  |
|  | Aniline (Parts by weight) [Equivalent] |  |  |  |  |  | 10[0.156] |  |
| Silicone-based surfactant | B8465 (Parts by weight) | 6 | 6 | 6 | 6 | 6 | 6 | 6 |
| Catalyst | Kao No. 25 (Parts by weight) | 0.06 | 0.06 | 0.06 | 0.04 | 0.06 |  | 0.06 |
| Isocyanate component | MILLIONATE MTL (parts by weight) | 95.88 | 101.66 | 93.09 | 113.59 | 94.89 | 101.45 | 84.34 |
| Physical properties | Average cell diameter (μm) | 83.8 | 87.8 | 87.6 | 80.2 | 84.8 | 71.2 | 74.9 |
|  | Interconnected cell rate (%) | 72.4 | 73.8 | 72.1 | 71.3 | 74.2 | 72.5 | 71.4 |
|  | Specific gravity | 0.484 | 0.484 | 0.465 | 0.471 | 0.476 | 0.478 | 0.462 |
|  | C hardness (degree) | 76 | 74 | 71 | 87 | 69 | 76 | 76 |
|  | Storage elastic modulus E' (40° C.) (MPa) | 125 | 120 | 110 | 170 | 93 | 122 | 120 |
|  | Cut rate (μ/min) | 5.8 | 7.3 | 4.2 | 9.6 | 4.4 | 6.8 | 2.6 |

[The Fourth Present Invention]
[Measurement and Evaluation Method]
(Measurement of Specific Gravity)

Determined according to JIS Z8807-1976. A manufactured unfoamed polyurethane resin cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd.).

(Measurement of Hardness)

Measurement is conducted according to JIS K6253-1997. A manufactured unfoamed polyurethane resin cut out in a size of 2 cm×2 cm (thickness: arbitrary) was used as a sample for measurement of hardness and left for 16 hours in an environment of a temperature of 23±2° C. and a humidity of 50%±5%. At the time of measurement, samples were stuck on one another to a thickness of 6 mm or more. A hardness meter (Asker D hardness meter, manufactured by Kobunshi Keiki Co., Ltd.) was used to measure hardness.

(Measurement of Cut Rate)

The polishing pad prepared was stuck onto a platen of a polishing apparatus (SPP600S, manufactured by Okamoto Machine Tool Works, Ltd.). Using a dresser (M type, manufactured by Asahi Diamond Industrial Co., Ltd.), the surface of a polishing layer was dressed under the conditions of a dressing load of 9.7 lbf, a dressing pressure of 50 g/cm$^2$, a platen rotation speed of 35 rpm, an amount of running water of 200 ml/min, and a dressing time of 30 minutes. After completion of the dressing, a strip sample (20 mm in width× 610 mm in length) was cut out. The thickness of the sample was measured at points spaced at intervals of 20 mm from the central part (15 points on one side, 30 points in total). The difference in thickness (abrasion loss) from the undressed central part was calculated at each measurement point, and then the average of the differences was calculated. The cut rate is calculated from the following equation. In the present invention, the cut rate is preferably 2 μm/min or more and is more preferably 2 to 4 μm/min.

Cut rate(μm/min)=Average of abrasion loss/(0.5×60)

(Evaluation of Scratches)

Evaluation of scratches was carried out by using a polishing apparatus SPP600S (manufactured by Okamoto Machine Tool Works, Ltd.) with the polishing pad prepared. After an 8-inch silicon wafer having a 1 μm-thick thermally-oxidized film formed thereon was polished under the following conditions, the number of defects of 0.19 to 2 μm in the wafer was measured at an EE (edge exclusion) of 5 mm by using a surface defect detector (Surf Scan SP1 TBI, manufactured by KLA-Tencor). The polishing conditions were as follows: silica slurry (SS12, manufactured by Cabot) added at a flow rate of 150 ml/min during polishing, a polishing load of 350 g/cm$^2$, a polishing platen rotation speed of 35 rpm, and a wafer rotation speed of 30 rpm.

Production Example 1

Synthesis of Prepolymer

To a vessel were added 1229 parts by weight of toluene diisocyanate (a mixture of toluene 2,4-diisocyanate/toluene 2,6-diisocyanate=80/20), 272 parts by weight of 4,4'-dicyclohexylmethane diisocyanate, 1901 parts by weight of polytetramethylene ether glycol having a number average molecular weight of 1018, and 198 parts by weight of diethylene glycol, and the mixture was allowed to react at 70° C. for 4 hours to obtain an isocyanate-terminated prepolymer A (NCO concentration: 2.22 meq/g).

Similarly, 204 parts by weight of toluene diisocyanate (a mixture of toluene 2,4-diisocyanate/toluene 2,6-diisocyanate=80/20) and 596 parts by weight of polytetramethylene ether glycol having a number average molecular weight of 1018 were charged into a vessel, and the contents were allowed to react at 70° C. for 4 hours to obtain an isocyanate-terminated prepolymer B (NCO concentration: 1.48 meq/g).

Example 1

To a reaction vessel were added 100 parts by weight of the isocyanate-terminated prepolymer A and 2.4 parts by weight (0.080 equivalent of hydroxyl group per 1 equivalent of isocyanate group) of ethylene glycol monophenyl ether, and the contents were mixed in a planetary mixing and defoaming apparatus, and defoamed to obtain a liquid mixture. After that, 24.1 parts by weight of 4,4'-methylenebis(o-chloroaniline) (IHARACUAMINE-MT, manufactured by Ihara Chemical Industry Co., Ltd.) which had been melted at 120° C. was added to the liquid mixture, and the resulting mixture was stirred and defoamed in a planetary mixing and defoaming apparatus to prepare a polyurethane raw material composition. The composition was poured into an open mold (800

MOCA: 4,4'-Methylenebis(o-chloroaniline) (IHARACUAMINE-MT, manufactured by Ihara Chemical Industry Co., Ltd.)
PhG: Ethylene glycol monophenyl ether (manufactured by Nippon Nyukazai Co., Ltd.)
PhDG: Diethylene glycol monophenyl ether (manufactured by Nippon Nyukazai Co., Ltd.)
PhFG: Propylene glycol monophenyl ether (manufactured by Nippon Nyukazai Co., Ltd.)

TABLE 4

| | | Example 1 | Example 2 | Example 3 | Example 4 | Example 5 | Example 6 | Example 7 | Example 8 | Comparative Example 1 |
|---|---|---|---|---|---|---|---|---|---|---|
| Prepolymer | Prepolymer A (Parts by weight) | 100 | 100 | 100 | 95 | 85 | 100 | 100 | 35 | 100 |
| | Prepolymer B (Parts by weight) | | | | | | | | 35 | |
| Polymerized diisocyanate | N3300 (Parts by weight) | | | | 5 | 15 | | | 30 | |
| Active hydrogen group-containing compound | MOCA (Parts by weight) | 24.1 | 20.5 | 24.6 | 25.8 | 29.2 | 24.3 | 23.1 | 28.8 | 26.5 |
| | PhG (Parts by weight) [Equivalent] | 2.4[0.080] | 6.2[0.206] | | 2.6[0.081] | 2.9[0.080] | | | 5.8[0.148] | |
| | PhDG (Parts by weight) [Equivalent] | | | 2.5[0.063] | | | | | | |
| | PhFG (Parts by weight) [Equivalent] | | | | | | 2.4[0.073] | | | |
| | Aniline (Parts by weight) [Equivalent] | | | | | | | 2.3[0.113] | | |
| Physical properties | Specific gravity | 1.1 | 1.1 | 1.1 | 1.1 | 1.1 | 1.1 | 1.1 | 1.1 | 1.1 |
| | D hardness (degree) | 64 | 56 | 59 | 65 | 68 | 61 | 66 | 64 | 70 |
| | Cut rate (μm/min) | 2.7 | 3.4 | 2.4 | 3.0 | 3.2 | 2.2 | 2.6 | 3.7 | 0.9 |
| | Scratch (number) | 41 | 28 | 35 | 43 | 50 | 39 | 45 | 42 | 110 | mm×800 mm in length and width, and 2.5 mm in depth) (casting vessel) and post curing was performed at 100° C. for 16 hours to obtain an unfoamed polyurethane resin sheet. The surface of the sheet was then buffed with a buffing machine (manufactured by AMITEC Corporation) until its thickness reached 1.27 mm, thereby to obtain a sheet with regulated thickness accuracy. The buffed sheet was punched into a piece with a diameter of 61 cm. Concentric circular grooves with a width of 0.25 mm, a pitch of 1.50 mm, and a depth of 0.40 mm were formed on the polishing surface of the piece using a grooving machine (manufactured by Techno Corporation), so that a polishing layer was obtained. A double-sided adhesive tape (Double Tack Tape, manufactured by Sekisui Chemical Co., Ltd.) was stuck onto the surface of the polishing layer opposite to the grooved surface using a laminator. Further, the surface of a corona-treated cushion layer (TORAYPEF (0.8 mm-thick polyethylene foam), manufactured by Toray Industries, Inc.) was buffed. The buffed cushion layer was stuck onto the double-sided adhesive tape using a laminator. Another double-sided adhesive tape was also stuck onto the other side of the cushion layer using a laminator so that a polishing pad was prepared.

Examples 2 to 8 and Comparative Example 1

Polishing pads were prepared in the same manner as in Example 1, except that the compositions described in Table 1 were used. The compounds shown in Table 1 are as follows.
Prepolymer A (NCO concentration: 2.22 meq/g)
Prepolymer B (NCO concentration: 1.48 meq/g)
N3300: Polymerized 1,6-hexamethylene diisocyanate (SUMIDUR N-3300, isocyanurate type, manufactured by Sumika Bayer Urethane Co., Ltd.)

INDUSTRIAL APPLICABILITY

A polishing pad of the invention is capable of performing planarization materials requiring a high surface planarity such as optical materials including a lens and a reflective mirror, a silicon wafer, an aluminum substrate and a product of general metal polishing with stability and a high polishing efficiency. A polishing pad of the invention is preferably employed, especially, in a planarization step of a silicon wafer or a device on which an oxide layer or a metal layer has been formed prior to further stacking an oxide layer or a metal layer thereon. Further, the polishing pad of the present invention is used preferably as a polishing pad for final polishing.

DESCRIPTION OF REFERENCE SIGNS

In the drawings, reference numeral 1 represents a polishing pad (polishing layer), 2 a polishing platen, 3 a polishing agent (slurry), 4 an object to be polished (semiconductor wafer), 5 a support (polishing head), 6 and 7 each a rotating shaft.

The invention claimed is:
1. A polishing pad comprising a polishing layer that is formed of a polyurethane resin foam having closed cells, wherein the polyurethane resin foam contains, as starting material components, (A) an isocyanate component, (B) a polyol component, and (C) an aromatic compound having one hydroxyl group and/or an aromatic compound having one amino group.
2. A polishing pad comprising a polishing layer that is formed of a polyurethane resin foam, wherein the polyurethane resin foam contains, as starting material components, (A) an isocyanate component, (B) a polyol component, (C) an aromatic compound having one hydroxyl group and/or an aromatic compound having one amino group, and (D) hollow microspheres.

3. A polishing pad comprising a polishing layer that is formed of a polyurethane resin foam having interconnected cells, wherein the polyurethane resin foam contains, as starting material components, (A) an isocyanate component, (B) a polyol component, and (C) an aromatic compound having one hydroxyl group and/or an aromatic compound having one amino group.

4. A polishing pad comprising a polishing layer that is formed of an unfoamed polyurethane resin, wherein the unfoamed polyurethane resin contains, as starting material components, (A) an isocyanate component, (B) a polyol component, and (C) an aromatic compound having one hydroxyl group and/or an aromatic compound having one amino group.

5. The polishing pad according to claim 1, wherein the aromatic compound having one hydroxyl group is a compound represented by the following general formula (1):

$$R^1\text{—}(OCH_2CHR^2)_n\text{—}OH \quad (1)$$

wherein $R^1$ is an aromatic hydrocarbon group, $R^2$ is hydrogen or a methyl group, and n is an integer of 1 to 5.

6. The polishing pad according to claim 1, wherein the aromatic compound having one amino group is aniline or a derivative thereof.

7. The polishing pad according to claim 1, wherein the content of the aromatic compound having one hydroxyl group and/or the aromatic compound having one amino group is an amount corresponding to 0.01 to 0.3 equivalent of active hydrogen group (hydroxyl group and/or amino group) of the aromatic compound per 1 equivalent of isocyanate group of the isocyanate component.

8. The polishing pad according to claim 1, wherein the cut rate is 3.5 to 10 µm/min.

9. The polishing pad according to claim 4, wherein the cut rate is 2 to 4 µm/min.

10. A method for manufacturing a semiconductor device, comprising the step of polishing a surface of a semiconductor wafer by using the polishing pad according to claim 1.

11. The polishing pad according to claim 2, wherein the aromatic compound having one hydroxyl group is a compound represented by the following general formula (1):

$$R^1\text{—}(OCH_2CHR^2)_n\text{—}OH \quad (1)$$

wherein $R^1$ is an aromatic hydrocarbon group, $R^2$ is hydrogen or a methyl group, and n is an integer of 1 to 5.

12. The polishing pad according to claim 3, wherein the aromatic compound having one hydroxyl group is a compound represented by the following general formula (1):

$$R^1\text{—}(OCH_2CHR^2)_n\text{—}OH \quad (1)$$

wherein $R^1$ is an aromatic hydrocarbon group, $R^2$ is hydrogen or a methyl group, and n is an integer of 1 to 5.

13. The polishing pad according to claim 4, wherein the aromatic compound having one hydroxyl group is a compound represented by the following general formula (1):

$$R^1\text{—}(OCH_2CHR^2)_n\text{—}OH \quad (1)$$

wherein $R^1$ is an aromatic hydrocarbon group, $R^2$ is hydrogen or a methyl group, and n is an integer of 1 to 5.

14. The polishing pad according to claim 2, wherein the aromatic compound having one amino group is aniline or a derivative thereof.

15. The polishing pad according to claim 3, wherein the aromatic compound having one amino group is aniline or a derivative thereof.

16. The polishing pad according to claim 4, wherein the aromatic compound having one amino group is aniline or a derivative thereof.

17. The polishing pad according to claim 2, wherein the content of the aromatic compound having one hydroxyl group and/or the aromatic compound having one amino group is an amount corresponding to 0.01 to 0.3 equivalent of active hydrogen group (hydroxyl group and/or amino group) of the aromatic compound per 1 equivalent of isocyanate group of the isocyanate component.

18. The polishing pad according to claim 3, wherein the content of the aromatic compound having one hydroxyl group and/or the aromatic compound having one amino group is an amount corresponding to 0.01 to 0.3 equivalent of active hydrogen group (hydroxyl group and/or amino group) of the aromatic compound per 1 equivalent of isocyanate group of the isocyanate component.

19. The polishing pad according to claim 4, wherein the content of the aromatic compound having one hydroxyl group and/or the aromatic compound having one amino group is an amount corresponding to 0.01 to 0.3 equivalent of active hydrogen group (hydroxyl group and/or amino group) of the aromatic compound per 1 equivalent of isocyanate group of the isocyanate component.

* * * * *